United States Patent
Jao et al.

(10) Patent No.: US 12,324,188 B2
(45) Date of Patent: Jun. 3, 2025

(54) FIELD EFFECT TRANSISTOR WITH SOURCE/DRAIN CONTACT ISOLATION STRUCTURE AND METHOD

(71) Applicant: Taiwan Semiconductor Manufacturing Co., Ltd., Hsinchu (TW)

(72) Inventors: Meng-Huan Jao, Hsinchu (TW); Lin-Yu Huang, Hsinchu (TW); Sheng-Tsung Wang, Hsinchu (TW); Huan-Chieh Su, Hsinchu (TW); Cheng-Chi Chuang, Hsinchu (TW); Chih-Hao Wang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 912 days.

(21) Appl. No.: 17/483,765

(22) Filed: Sep. 23, 2021

(65) Prior Publication Data
US 2022/0359677 A1    Nov. 10, 2022

Related U.S. Application Data

(60) Provisional application No. 63/185,294, filed on May 6, 2021.

(51) Int. Cl.
*H01L 23/522* (2006.01)
*H01L 21/02* (2006.01)
*H10D 30/01* (2025.01)
*H10D 30/67* (2025.01)
(Continued)

(52) U.S. Cl.
CPC ..... *H10D 30/6729* (2025.01); *H01L 21/0259* (2013.01); *H10D 30/031* (2025.01); *H10D 30/6735* (2025.01); *H10D 30/6757* (2025.01); *H10D 62/118* (2025.01); *H10D 64/01* (2025.01)

(58) Field of Classification Search
CPC .......... H01L 29/41733; H01L 21/0259; H01L 29/0665; H01L 29/401; H01L 29/42392; H01L 29/66742; H01L 29/78696; H10D 30/6729; H10D 30/031; H10D 30/6735; H10D 30/6757; H10D 62/118; H10D 64/01; H10D 18/60; H10D 1/66; H10D 84/0188; H10D 84/201; H10D 84/0107; A61K 40/4218; H02K 15/027; H10H 20/826;
(Continued)

(56) References Cited

U.S. PATENT DOCUMENTS

| 9,236,267 B2 | 1/2016 | De et al. |
| 9,502,265 B1 | 11/2016 | Jiang et al. |
| 9,520,466 B2 | 12/2016 | Holland et al. |

(Continued)

*Primary Examiner* — Samuel Park
(74) *Attorney, Agent, or Firm* — Seed IP Law Group LLP

(57) ABSTRACT

A device includes a substrate and a gate structure wrapping around at least one vertical stack of nanostructure channels. The device includes a source/drain region abutting the gate structure, and a source/drain contact over the source/drain region. The device includes an etch stop layer laterally between the source/drain contact and the gate structure and having a first sidewall in contact with the source/drain contact, and a second sidewall opposite the first sidewall. The device includes a source/drain contact isolation structure embedded in the source/drain contact and having a third sidewall substantially coplanar with the second sidewall of the etch stop layer.

20 Claims, 37 Drawing Sheets

(51) Int. Cl.
*H10D 62/10* (2025.01)
*H10D 64/01* (2025.01)

(58) Field of Classification Search
CPC ... H10F 77/955; H10F 30/2863; A23B 2/783; B65D 83/166; B82Y 10/00; A45C 11/003
See application file for complete search history.

(56) References Cited

U.S. PATENT DOCUMENTS

| | | |
|---|---|---|
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 9,786,774 B2 | 10/2017 | Colinge et al. |
| 9,853,101 B2 | 12/2017 | Peng et al. |
| 9,881,993 B2 | 1/2018 | Ching et al. |
| 10,700,064 B1 * | 6/2020 | Zhang ............... H01L 29/78 |
| 2016/0163585 A1 * | 6/2016 | Xie ............... H01L 21/76802 |
| | | 257/368 |
| 2016/0254197 A1 * | 9/2016 | Lenox ............ H01L 21/823828 |
| | | 257/369 |
| 2016/0308048 A1 * | 10/2016 | Ching ............... H01L 21/7624 |
| 2017/0179301 A1 * | 6/2017 | Ching ............... H01L 29/42392 |
| 2017/0221886 A1 * | 8/2017 | Wei ............... H01L 29/41758 |
| 2018/0337176 A1 * | 11/2018 | Lee ............... H01L 21/823481 |
| 2019/0131411 A1 * | 5/2019 | Chew ............... H01L 21/31053 |
| 2019/0157404 A1 * | 5/2019 | Cheng ............... H01L 21/76805 |
| 2020/0006155 A1 * | 1/2020 | Chiang ............ H01L 21/823864 |
| 2020/0027992 A1 * | 1/2020 | Jung ............... H01L 29/78696 |
| 2020/0035543 A1 * | 1/2020 | Zang ............... H01L 21/823431 |
| 2020/0035555 A1 * | 1/2020 | Zang ............... H01L 21/7684 |
| 2020/0373387 A1 * | 11/2020 | Lee ............... H01L 21/823468 |
| 2021/0234020 A1 * | 7/2021 | Mochizuki ........ H01L 29/42392 |

\* cited by examiner

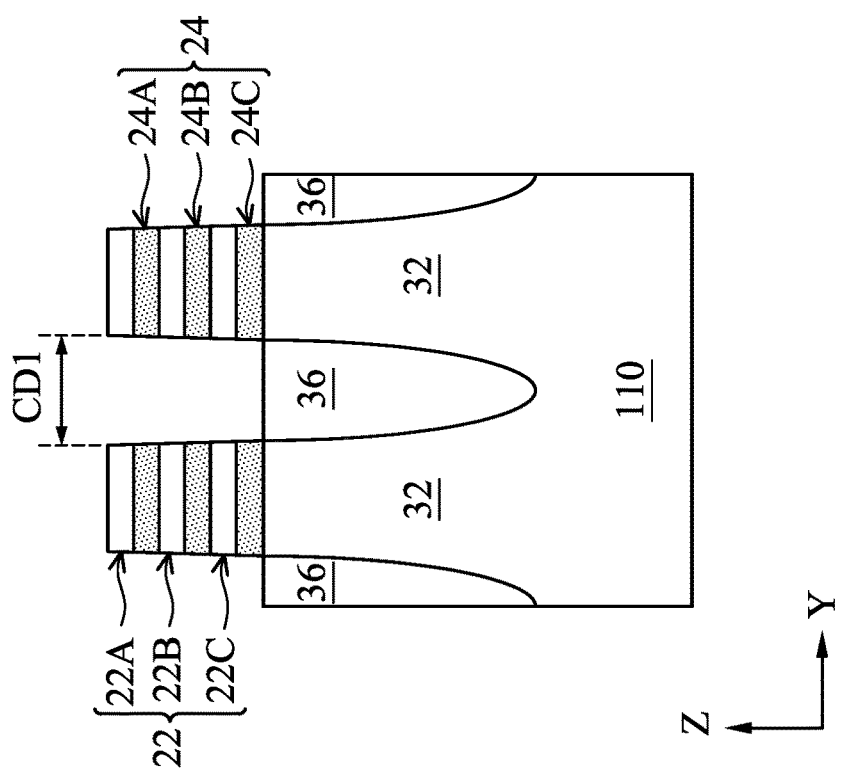
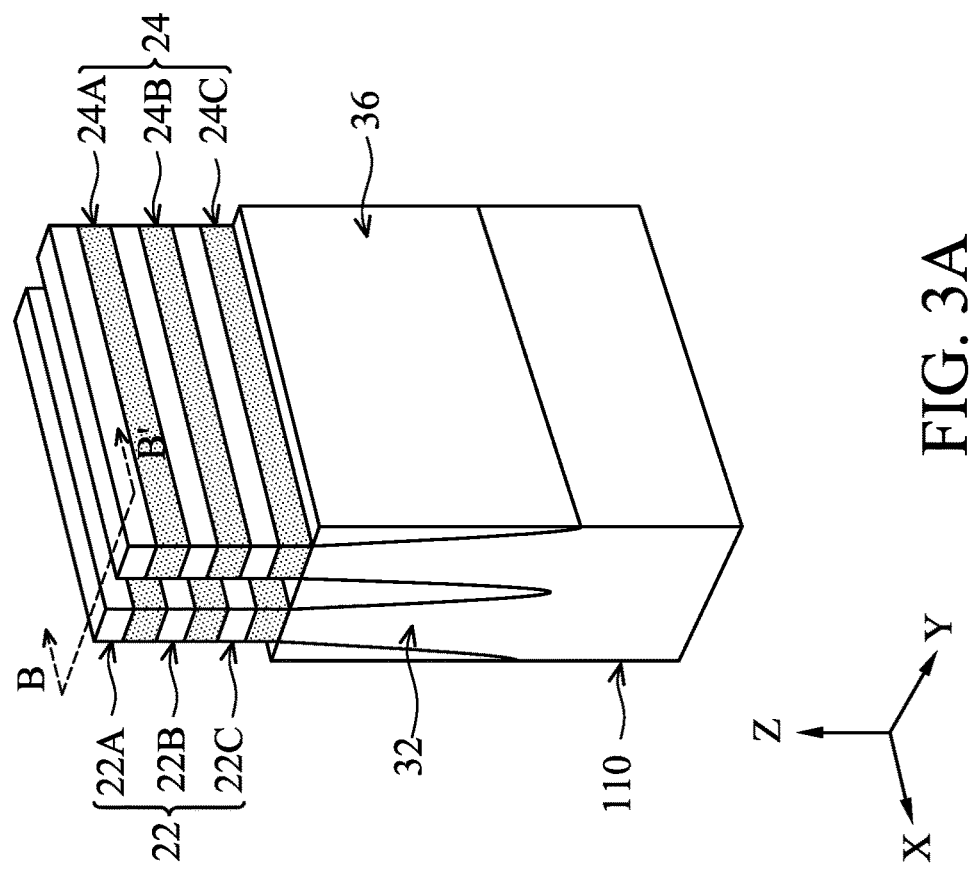
FIG. 3B
FIG. 3A

FIELD EFFECT TRANSISTOR WITH SOURCE/DRAIN CONTACT ISOLATION STRUCTURE AND METHOD

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A-16C are views of various embodiments of an IC device of at various stages of fabrication according to various aspects of the present disclosure.

DETAILED DESCRIPTION

Figure 1A:
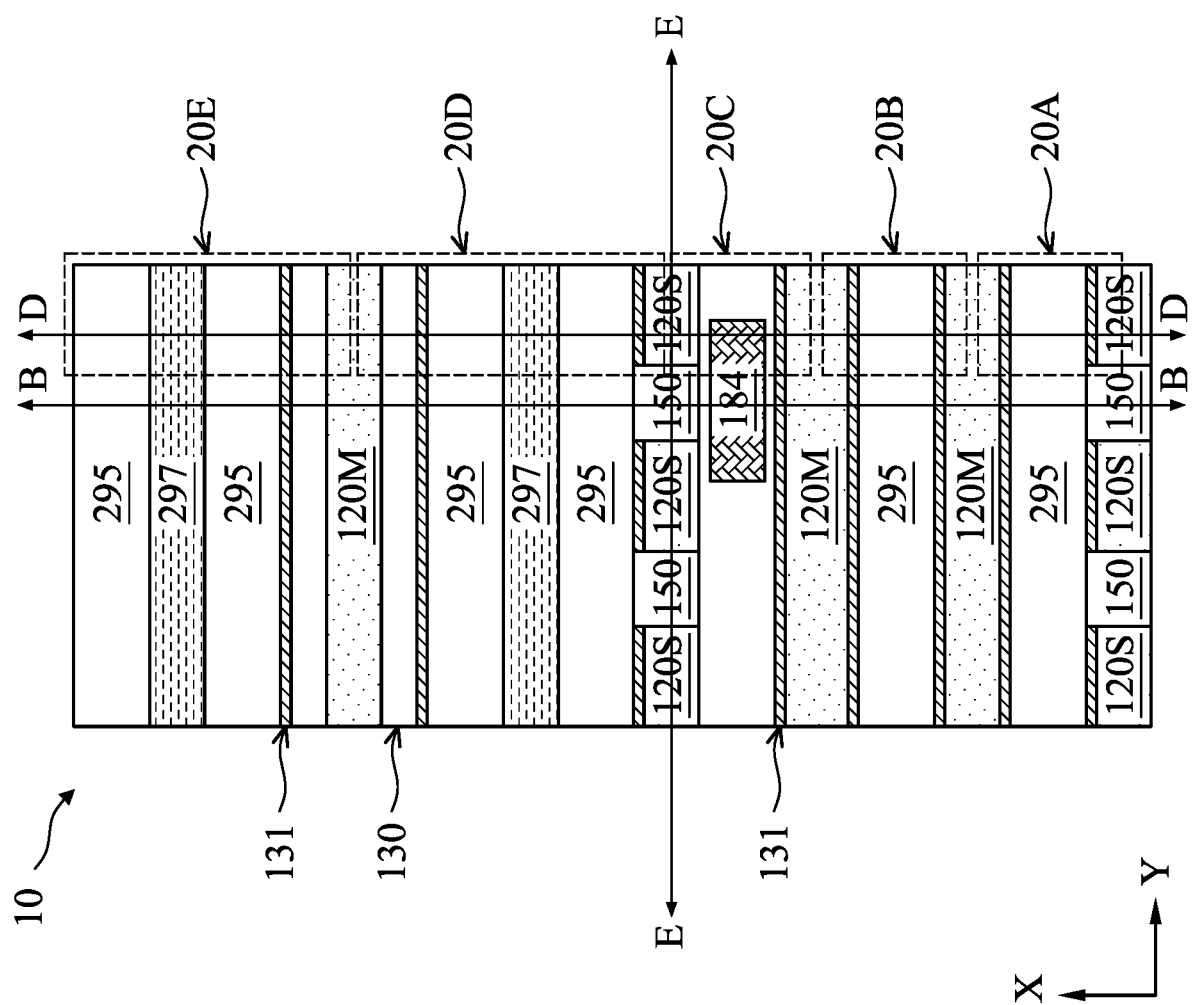
FIGS. 1A-1F are diagrammatic top and cross-sectional side views of a portion of an IC device fabricated according to embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Terms indicative of relative degree, such as "about," "substantially," and the like, should be interpreted as one having ordinary skill in the art would in view of current technological norms. Generally, the term "substantially" indicates a tighter tolerance than the term "about." For example, a thickness of "about 100 units" will include a larger range of values, e.g., 70 units to 130 units (+/−30%), than a thickness of "substantially 100 units," which will include a smaller range of values, e.g., 95 units to 105 units (+/−5%). Again, such tolerances (+/−30%, +/−5%, and the like) may be process- and/or equipment-dependent, and should not be interpreted as more or less limiting than a person having ordinary skill in the art would recognize as normal for the technology under discussion, other than that "about" as a relative term is not as stringent as "substantially" when used in a similar context.

The present disclosure is generally related to semiconductor devices, and more particularly to field-effect transistors (FETs), such as planar FETs, three-dimensional fin-line FETs (FinFETs), or gate-all-around (GAA) devices. In advanced technology nodes, dimension scaling can lead to difficulties forming isolated contacts to features of the semiconductor devices. Source/drain isolation structures formed by methods described herein achieve improved yield by reducing sidewall merging that leads to voids in the isolation structures. The merging is reduced or eliminated by removing (partially or fully) a contact etch stop layer (CESL) from sidewalls prior to depositing material of the isolation structures. Removal of the CESL prior to deposition increases spacing between the sidewalls, which reduces the occurrence of merging during deposition.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Figure 1B:
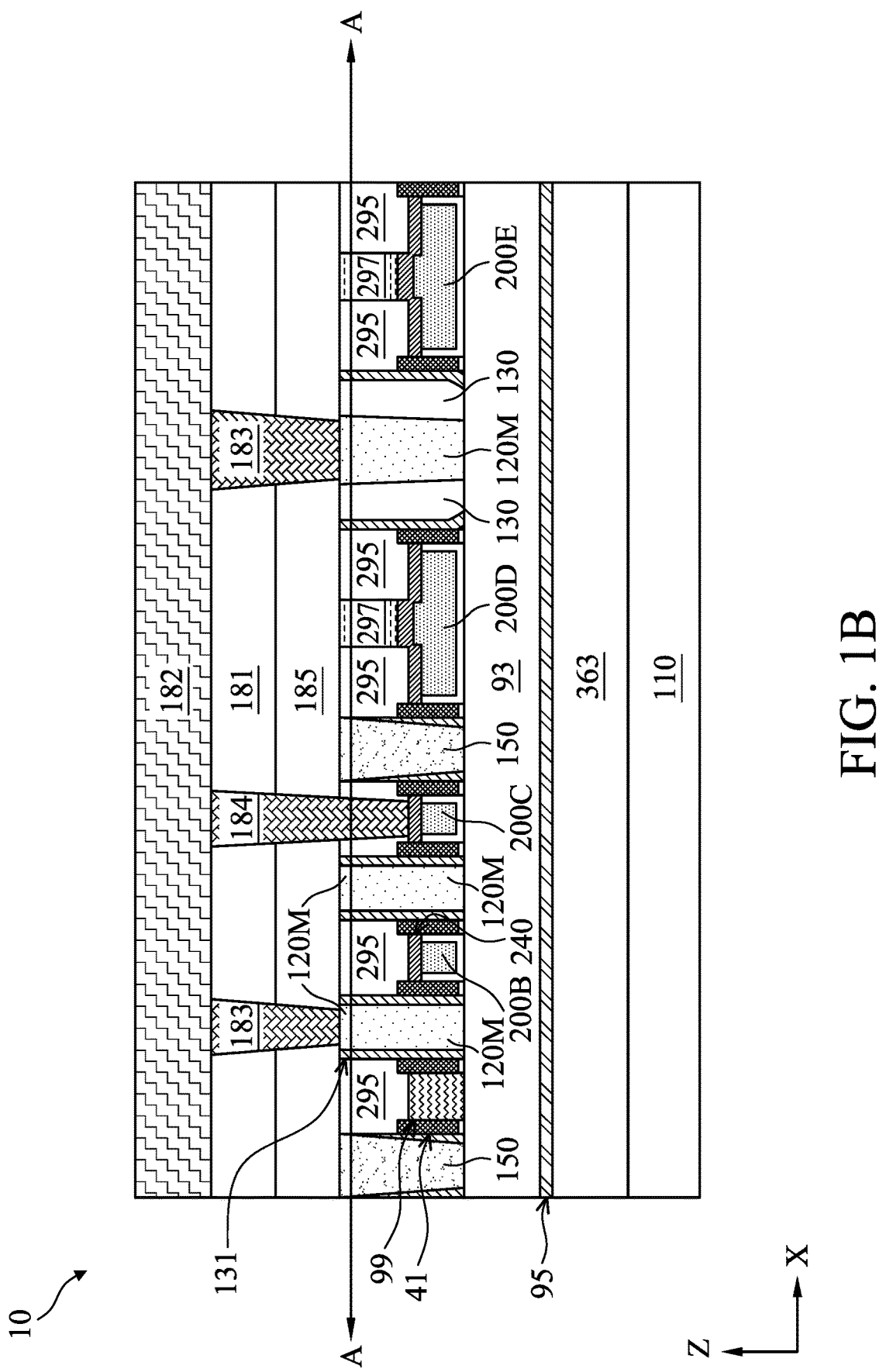
Figure 1C:
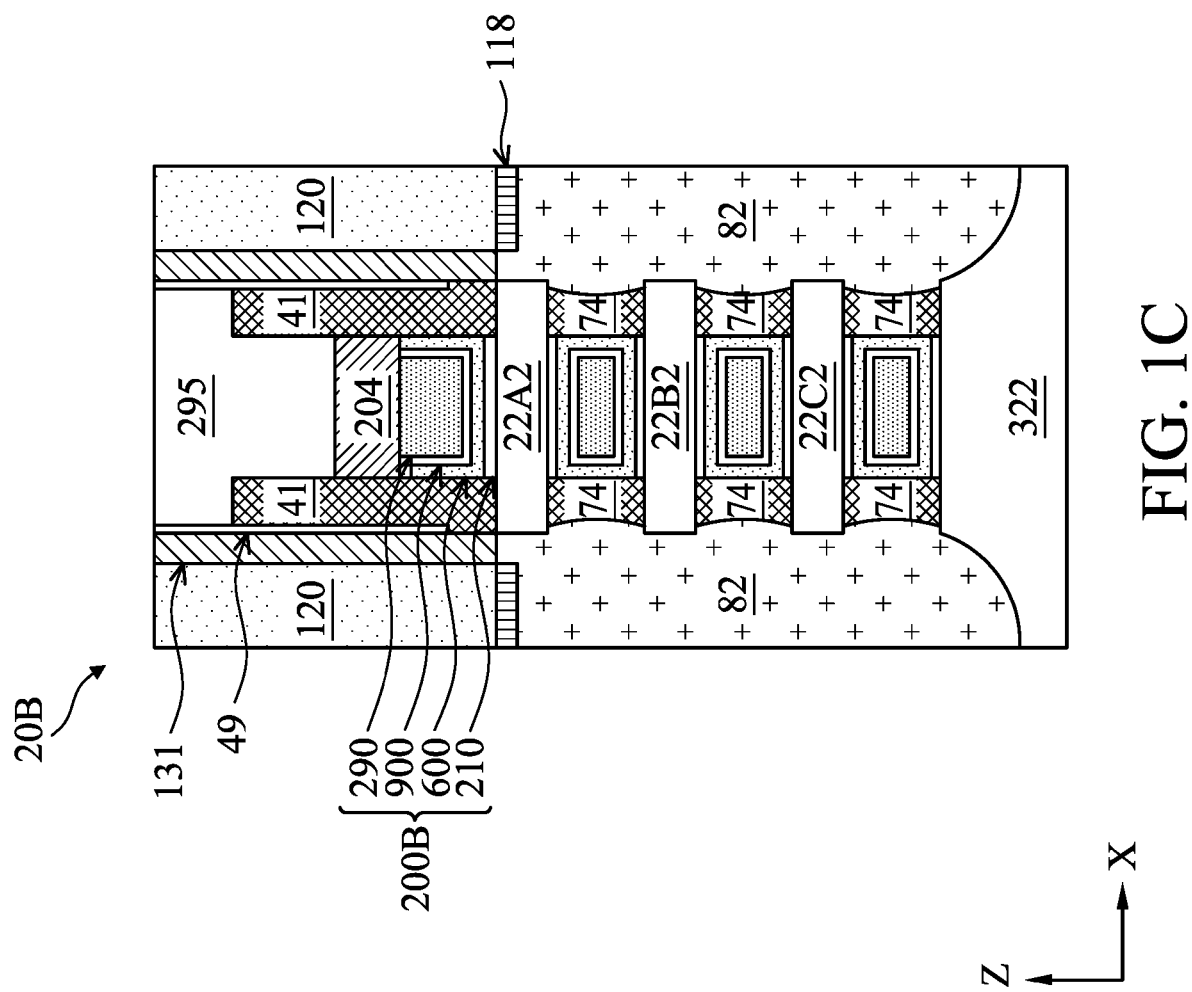
Figure 1D:
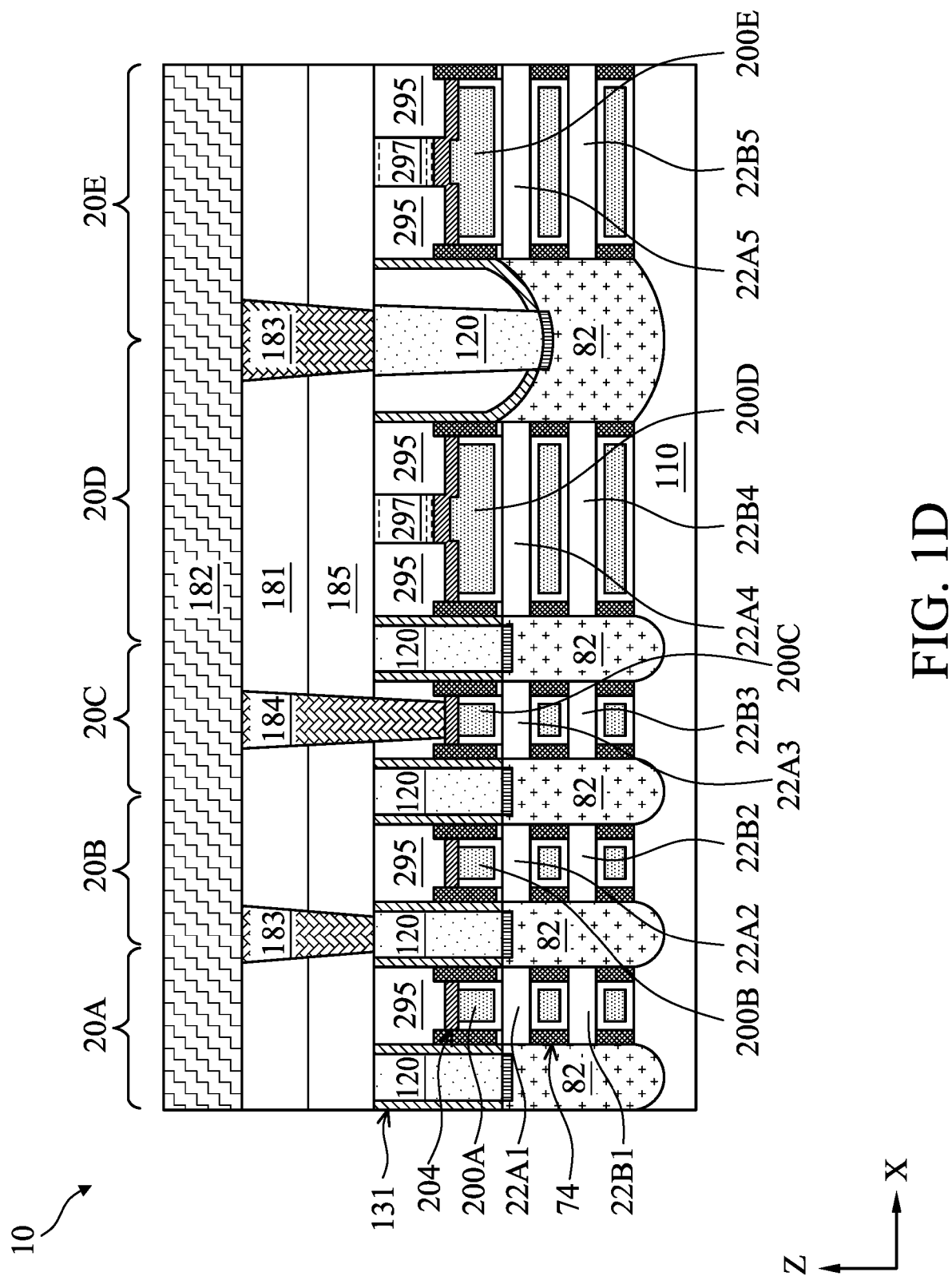
Figure 1E:
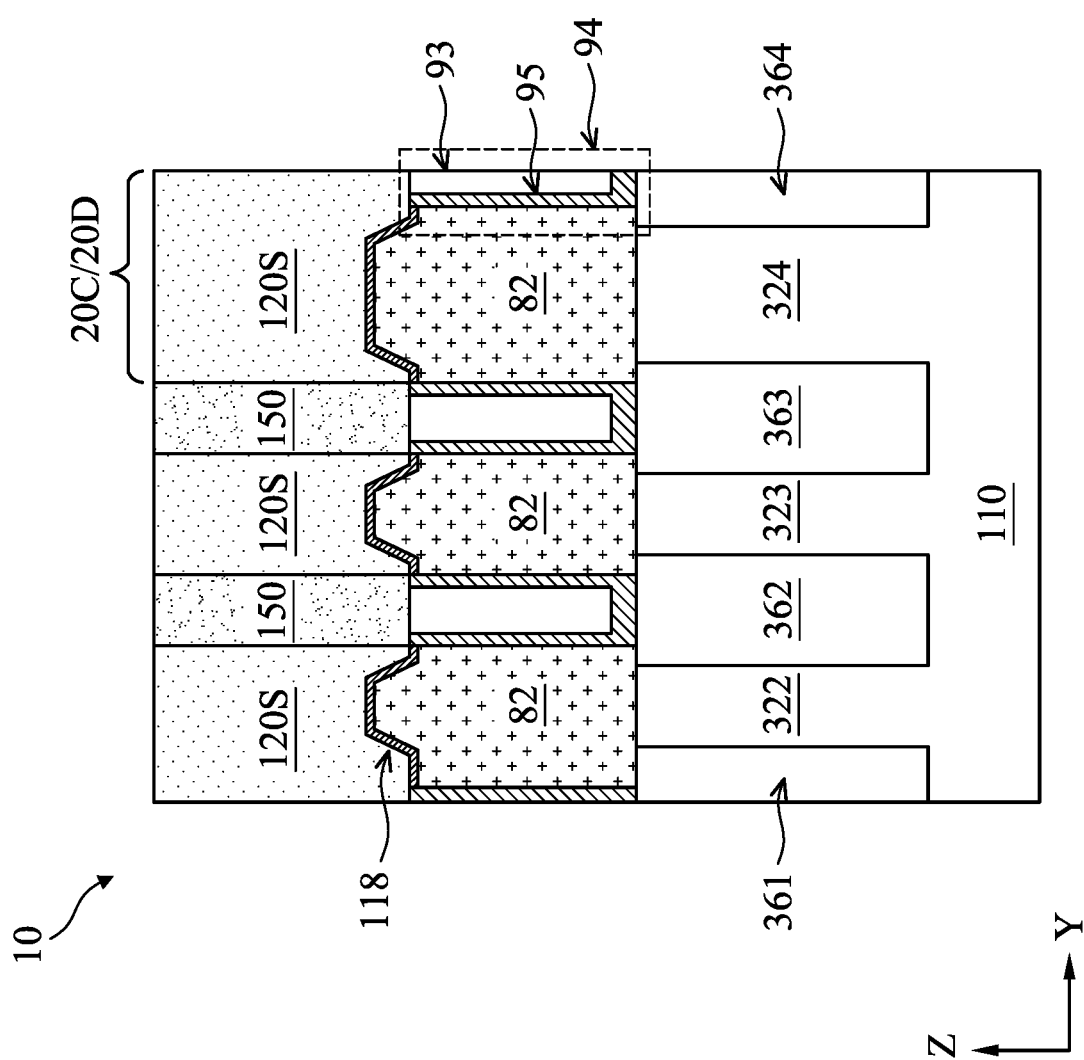
Figure 1F:
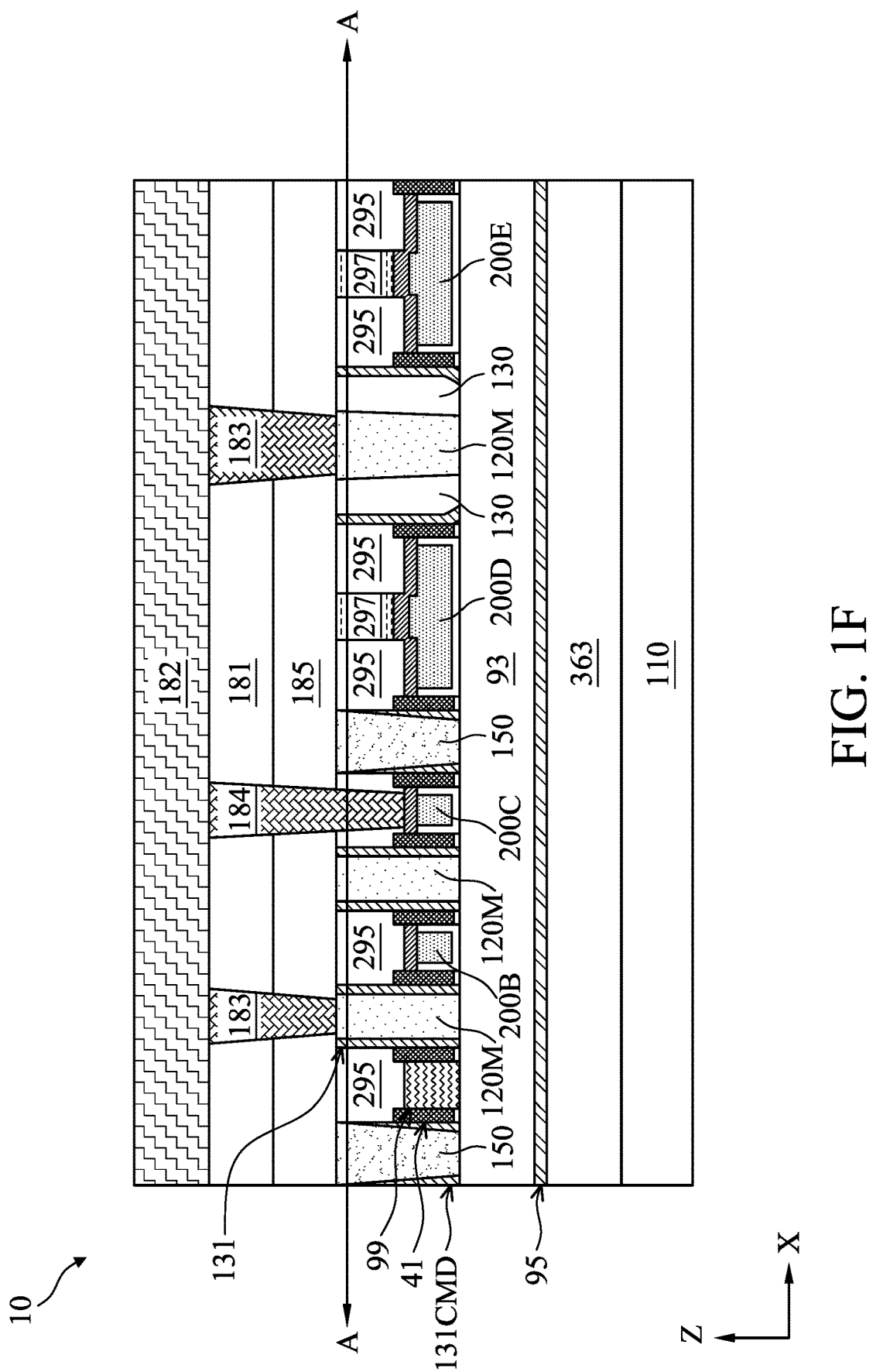

FIGS. 1A-1F illustrate diagrammatic top and cross-sectional side views of a portion of an IC device 10 fabricated according to embodiments of the present disclosure, where the IC device 10 includes gate-all-around (GAA) devices 20A-20E. FIG. 1A is a diagrammatic top view of the portion of the IC device 10 including the GAA devices 20A-20E. FIG. 1B is a cross-sectional side view of a portion of the IC device 10 along the line B-B shown in FIG. 1A. FIG. 1C is a cross-sectional side view of single GAA device 20B. FIG. 1D is a cross-sectional side view of a portion of the IC device 10 along the line D-D shown in FIG. 1A. FIG. 1E is a cross-sectional side view of a portion of the IC device 10 along the line E-E shown in FIG. 1A. FIG. 1F is a cross-sectional side view of a portion of the IC device 10 along the line E-E shown in FIG. 1A in accordance with various embodiments. Certain features are removed from view intentionally in the top view of FIG. 1A for simplicity of illustration.

The GAA devices 20A-20E may include at least an N-type FET (NFET) or a P-type FET (PFET) in some embodiments. Integrated circuit devices such as the IC device 10 frequently include transistors having different threshold voltages based on their function in the IC device. For example, input/output (IO) transistors typically have the highest threshold voltages, core logic transistors typically have the lowest threshold voltages, and a third threshold voltage between that of the IO transistors and that of the core logic transistors may also be employed for certain other functional transistors, such as static random access memory (SRAM) transistors. Some circuit blocks within the IC device 10 may include two or more NFETs and/or PFETs of two or more different threshold voltages.

Referring to FIGS. 1A-1E, the GAA devices 20A-20E (see FIG. 1D) are formed over and/or in a substrate 110, and generally include gate structures 200A-200E straddling and/or wrapping around semiconductor channels 22A1-22B5, alternately referred to as "nanostructures," located over semiconductor fins 321-325 protruding from, and separated by, isolation structures 361-364 (see FIG. 1E). The channels are labeled "22AX" to "22BX," where "X" is an integer from 1 to 5, corresponding to the five transistors 20A-20E, respectively. Each gate structure 200A-200E controls current flow through the channels 22A1-22B5.

Referring to FIG. 1C, the cross-sectional view of the IC device 10 in FIG. 1D is taken along an X-Z plane, where the X-direction is the horizontal direction, and the Z-direction is the vertical direction. The cross-sectional view in FIG. 1C shows a single GAA device 20B of the GAA devices 20A-20E for simplicity of illustration, and the related description is generally applicable to the other GAA devices 20A, 20C-20E. In FIG. 1C, the GAA device 20B is shown including three channels 22A2-22C2, which are laterally abutted by source/drain features 82, and covered and surrounded by the gate structure 200B. Generally, the number of channels 22 is two (as shown in FIG. 1D) or more than two, such as three (FIG. 1C) or four or more. The gate structure 200B controls flow of electrical current through the channels 22A2-22C2 to and from the source/drain features 82 based on voltages applied at the gate structure 200B and at the source/drain features 82.

In some embodiments, the fin structure 322 includes silicon. In some embodiments, the GAA device 20B is an NFET, and the source/drain features 82 thereof include silicon phosphorous (SiP). In some embodiments, the GAA device 20B is a PFET, and the source/drain features 82 thereof include silicon germanium (SiGe).

The channels 22A2-22C2 each include a semiconductive material, for example silicon or a silicon compound, such as silicon germanium, or the like. The channels 22A2-22C2 are nanostructures (e.g., having sizes that are in a range of a few nanometers) and may also each have an elongated shape and extend in the X-direction. In some embodiments, the channels 22A2-22C2 each have a nano-wire (NW) shape, a nano-sheet (NS) shape, a nano-tube (NT) shape, or other suitable nanoscale shape. The cross-sectional profile of the channels 22A2-22C2 may be rectangular, round, square, circular, elliptical, hexagonal, or combinations thereof.

In some embodiments, the lengths (e.g., measured in the X-direction) of the channels 22A2-22C2 may be different from each other, for example due to tapering during a fin etching process. In some embodiments, length of the channel 22A1 may be less than a length of the channel 22B1, which may be less than a length of the channel 22C1. The channels 22A2-22C2 each may not have uniform thickness, for example due to a channel trimming process used to expand spacing (e.g., measured in the Z-direction) between the channels 22A2-22C2 to increase gate structure fabrication process window. For example, a middle portion of each of the channels 22A2-22C2 may be thinner than the two ends of each of the channels 22A2-22C2. Such shape may be collectively referred to as a "dog-bone" shape.

In some embodiments, the spacing between the channels 22A2-22C2 (e.g., between the channel 22B2 and the channel 22A2 or the channel 22C2) is in a range between about 8 nanometers (nm) and about 12 nm. In some embodiments, a thickness (e.g., measured in the Z-direction) of each of the channels 22A2-22C2 is in a range between about 5 nm and about 8 nm. In some embodiments, a width (e.g., measured in the Y-direction, not shown in FIG. 1C, orthogonal to the X-Z plane) of each of the channels 22A2-22C2 is at least about 8 nm.

The gate structure 200B is disposed over and between the channels 22A2-22C2, respectively. In some embodiments, the gate structure 200B is disposed over and between the channels 22A2-22C2, which are silicon channels for N-type devices or silicon germanium channels for P-type devices. In some embodiments, the gate structure 200B includes an interfacial layer (IL) 210, one or more gate dielectric layers 600, one or more work function tuning layers 900, and a metal fill layer 290.

The interfacial layer 210, which may be an oxide of the material of the channels 22A2-22C2, is formed on exposed areas of the channels 22A2-22C2 and the top surface of the fin 322. The interfacial layer 210 promotes adhesion of the gate dielectric layers 600 to the channels 22A2-22C2. In some embodiments, the interfacial layer 210 has thickness of about 5 Angstroms (A) to about 50 Angstroms (A). In some embodiments, the interfacial layer 210 has thickness of about 10 A. The interfacial layer 210 having thickness that is too thin may exhibit voids or insufficient adhesion properties. The interfacial layer 210 being too thick consumes gate fill window, which is related to threshold voltage tuning and resistance as described above. In some embodiments, the interfacial layer 210 is doped with a dipole, such as lanthanum, for threshold voltage tuning.

In some embodiments, the gate dielectric layer 600 includes at least one high-k gate dielectric material, which may refer to dielectric materials having a high dielectric constant that is greater than a dielectric constant of silicon oxide (k≈3.9). Exemplary high-k dielectric materials include $HfO_2$, HfSiO, HfSiON, HfTaO, HfTiO, HfZrO, $ZrO_2$, $Ta_2O_5$, or combinations thereof. In some embodiments, the gate dielectric layer 600 has thickness of about 5 A to about 100 A.

In some embodiments, the gate dielectric layer 600 may include dopants, such as metal ions driven into the high-k gate dielectric from $La_2O_3$, MgO, $Y_2O_3$, $TiO_2$, $Al_2O_3$, $Nb_2O_5$, or the like, or boron ions driven in from $B_2O_3$, at a concentration to achieve threshold voltage tuning. As one example, for N-type transistor devices, lanthanum ions in higher concentration reduce the threshold voltage relative to layers with lower concentration or devoid of lanthanum ions, while the reverse is true for P-type devices. In some embodiments, the gate dielectric layer 600 of certain transistor devices (e.g., 10 transistors) is devoid of the dopant that is present in certain other transistor devices (e.g., N-type core logic transistors or P-type 10 transistors). In N-type 10 transistors, for example, relatively high threshold voltage is desirable, such that it may be preferable for the 10 transistor high-k dielectric layers to be free of lanthanum ions, which would otherwise reduce the threshold voltage.

In some embodiments, the gate structure 200B further includes one or more work function metal layers, represented collectively as work function metal layer 900. When configured as an NFET, the work function metal layer 900 of the GAA device 20B may include at least an N-type work function metal layer, an in-situ capping layer, and an oxygen blocking layer. In some embodiments, the N-type work function metal layer is or comprises an N-type metal material, such as TiAlC, TiAl, TaAlC, TaAl, or the like. The in-situ capping layer is formed on the N-type work function metal layer, and may comprise TiN, TiSiN, TaN, or another suitable material. The oxygen blocking layer is formed on the in-situ capping layer to prevent oxygen diffusion into the N-type work function metal layer, which would cause an undesirable shift in the threshold voltage. The oxygen blocking layer may be formed of a dielectric material that can stop oxygen from penetrating to the N-type work function metal layer, and may protect the N-type work function metal layer from further oxidation. The oxygen blocking layer may include an oxide of silicon, germanium, SiGe, or another suitable material. In some embodiments, the work function metal layer 900 includes more or fewer layers than those described.

The work function metal layer 900 may further include one or more barrier layers comprising a metal nitride, such as TiN, WN, MoN, TaN, or the like. Each of the one or more barrier layers may have thickness ranging from about 5 A to about 20 A. Inclusion of the one or more barrier layers provides additional threshold voltage tuning flexibility. In general, each additional barrier layer increases the threshold voltage. As such, for an NFET, a higher threshold voltage device (e.g., an 10 transistor device) may have at least one or more than two additional barrier layers, whereas a lower threshold voltage device (e.g., a core logic transistor device) may have few or no additional barrier layers. For a PFET, a higher threshold voltage device (e.g., an 10 transistor device) may have few or no additional barrier layers, whereas a lower threshold voltage device (e.g., a core logic transistor device) may have at least one or more than two additional barrier layers. In the immediately preceding discussion, threshold voltage is described in terms of magnitude. As an example, an NFET 10 transistor and a PFET 10 transistor may have similar threshold voltage in terms of magnitude, but opposite polarity, such as +1 Volt for the NFET 10 transistor and −1 Volt for the PFET 10 transistor. As such, because each additional barrier layer increases threshold voltage in absolute terms (e.g., +0.1 Volts/layer), such an increase confers an increase to NFET transistor threshold voltage (magnitude) and a decrease to PFET transistor threshold voltage (magnitude).

The gate structure 200B also includes metal fill layer 290. The metal fill layer 290 may include a conductive material such as tungsten, cobalt, ruthenium, iridium, molybdenum, copper, aluminum, or combinations thereof. Between the channels 22A2-22C2, the metal fill layer 290 is circumferentially surrounded (in the cross-sectional view) by the one or more work function metal layers 900, which are then circumferentially surrounded by the gate dielectric layers 600. The gate structure 200B may also include a glue layer that is formed between the one or more work function layers 900 and the metal fill layer 290 to increase adhesion. The glue layer is not specifically illustrated in FIGS. 1A-1F for simplicity.

The GAA devices 20A-20E also include gate spacers 41 and inner spacers 74 that are disposed on sidewalls of the gate dielectric layer 600 and the IL 210. The inner spacers 74 are also disposed between the channels 22A2-22C2. The gate spacers 41 and the inner spacers 74 may include a dielectric material, for example a low-k material such as SiOCN, SiON, SiN, or SiOC. In some embodiments, one or more additional spacer layers 49 are present abutting the gate spacers 41, as shown in FIG. 1C.

The GAA devices 20A-20E may further include source/drain contacts 120M, 120S (shown in FIG. 1A; collectively referred to as "source drain contacts 120") that are formed over the source/drain features 82. The source/drain contacts 120 may include a conductive material such as tungsten, ruthenium, cobalt, copper, titanium, titanium nitride, tantalum, tantalum nitride, iridium, molybdenum, nickel, aluminum, or combinations thereof. The source/drain contacts 120 may be surrounded by barrier layers (not shown), such as SiN or TiN, which help prevent or reduce diffusion of materials from and into the source/drain contacts 120. A silicide layer 118 may also be formed between the source/drain features 82 and the source/drain contacts 120, so as to reduce the source/drain contact resistance. The silicide layer 118 includes nickel, cobalt, titanium, tantalum, platinum, tungsten, other noble metals, other refractory metals, rare earth metals or their alloys. In some embodiments, thickness of the silicide layer 118 (in the Z direction) is in a range of about 0.5 nm to about 5 nm. In some embodiments, height of the source/drain contacts 120 may be in a range of about 1 nm to about 50 nm.

As shown in FIGS. 1A and 1D-1F, one or more of the source/drain contacts, labeled 120M, may each overlie multiple GAA devices along the Y-direction. In some embodiments, others of the source/drain contacts, labeled 120S, may each overlie a single GAA device along the Y-direction. FIG. 1E illustrates a cross-sectional side view in the Y-Z plane along the line E-E of FIG. 1A, in which source/drain contacts 120S overlie source/drain regions 82 and are separated by source/drain contact isolation structures 150. Formation of the source/drain contact isolation structures 150 is described in further detail with reference to FIGS. 13A-16C.

In some embodiments, each of the source/drain regions 82 is formed over a respective fin 322, 323, 324, and is separated from others of the source/drain regions 82 by hybrid fins 94 (or "inactive fins 94") formed over isolation regions 361-364. In some embodiments, the isolation regions 361-364 are shallow trench isolation ("STI") regions. In some embodiments, each of the hybrid fins 94 includes a liner layer 93 (or "dielectric layer 93") and a fill layer 95 (or "oxide layer 95"). Each of the source/drain contact isolation structures 150 may extend from an upper surface of a respective hybrid fin 94 to at least upper surfaces of the source/drain contacts 120S abutting either side of the source/drain contact isolation structure 150, such that the source/drain contact isolation structure 150 completely electrically isolates the source drain contact 120S on a first side of the source/drain contact isolation structure 150 from the source drain contact 120S on a second opposite side of the source/drain contact isolation structure 150. In the Y direction, each of the source/drain contact isolation structures 150 may extend from a first sidewall of the source/drain contact 120S on the first side of the source/drain contact isolation structure 150 to a second side wall of the source/drain contact 120S on the second side of the source/drain contact isolation structure 150. In some embodiments, each of the source/drain contact isolation structures 150 has a first sidewall (or first sidewall portion) in direct physical contact with the source/drain contact 120S on its first side and a second side wall (or second side wall portion) in direct physical contact with the source/drain contact 120S on it second side.

In some embodiments, each of the source/drain contact isolation structures 150 is or includes SiN, SiCN, SiC, SiOC, SiOCN, HfO2, ZrO2, ZrAlOx, HfAlOx, HfSiOx, Al2O3, or another suitable dielectric material. In some embodiments, width of the source/drain contact isolation structures 150 (along the Y direction) is in a range of about 8 nm to about 30 nm. The source/drain contact isolation structures 150 are formed following thinning or complete removal of an etch stop layer 131, as described in greater detail with reference to FIGS. 13A-16C. As such, aspect ratio, which is a ratio of height of the source/drain contact isolation structures 150 (Z-axis direction) over width of the source/drain contact isolation structures 150 (X-axis direction), is less than 7, such as less than about 5. The aspect ratio being less than about 5 is generally associated with an intact source/drain contact isolation structure 150, meaning the source/drain contact isolation structure 150 may be substantially free of voids that form by upper portions of the source/drain contact isolation structure 150 merging during deposition prior to middle or lower portions of the source/drain contact isolation structure 150 merging.

FIGS. 1D and 1E show a configuration in which the etch stop layer 131 is completely removed prior to forming the source/drain contact isolation structures 150. In FIG. 1F, a configuration is shown in which the etch stop layer, labeled "131CMD," is thinned and not completely removed. In some embodiments, prior to forming the source/drain contact isolation structures 150, the etch stop layer 131CMD is formed by thinning the etch stop layer 131 originally present in the space in which the source/drain contact isolation structures 150 are to be formed. In some embodiments, following the thinning, the etch stop layer 131CMD has a tapered profile, as shown in FIG. 1F. Thickness of the etch stop layer 131CMD may be in a range of about 0.1 nm to about 2 nm. In some embodiments, the tops of the etch stop layer 131CMD may be recessed relative to the top of the source/drain contact isolation structures 150, such that an upper portion of sidewalls of the source/drain contact isolation structures 150 are in direct physical contact with neighboring structures, such as self-aligned contact ("SAC") gate protection structures 295 and/or the source/drain contacts 120. Generally, thickness of the etch stop layer 131CMD does not exceed thickness of the etch stop layer 131. In some embodiments, ratio of the thickness of the etch stop layer 131 over the thickness of the etch stop layer 131CMD is in a range of about 2 to about 10. The ratio being less than about 2 may lead to insufficient aspect ratio in the source/drain contact isolation structures 150, such that voids may form during formation of the source/drain contact isolation structures 150.

Again to FIG. 1D, certain of the GAA devices, such as the GAA devices 20D, 20E, further include an interlayer dielectric (ILD) 130. The ILD 130 provides electrical isolation between the various components of the GAA devices 20D, 20E discussed above, for example between the gate structures 200D, 200E and the source/drain contact 120M therebetween. The etch stop layer 131 may be formed prior to forming the ILD 130, and may be positioned laterally between the ILD 130 and the gate spacers 41 and vertically between the ILD 130 and the source/drain features 82. In some embodiments, the etch stop layer 131 is or includes SiN, SiCN, SiC, SiOC, SiOCN, HfO2, ZrO2, ZrAlOx, HfAlOx, HfSiOx, Al2O3, or other suitable material. In some embodiments, thickness of the etch stop layer 131 is in a range of about 1 nm to about 5 nm.

Vias 183, 184, which include source/drain vias 183 and gate via 184 are shown in accordance with various embodiments. In some embodiments, an etch stop layer 185 overlies the source/drain contacts 120M/120S, the capping layer 295, and the source/drain contact isolation structures 150. A dielectric layer 181, such as a second ILD 181, overlies the etch stop layer 185. In some embodiments, the dielectric layer 181 is or includes a low-k dielectric material, such as SiC, SiOC, SiON, SiOCN, or the like, and the etch stop layer 185 is or includes a different dielectric material, such as SiN, or other suitable material. The gate via 184 extends through the dielectric layer 181, the etch stop layer 185 and the capping layer 295, and lands on the conductive layer 204 or the gate fill layer 290 of the gate structure 200C. The source/drain vias 183 extend through the dielectric layer 181 and the etch stop layer 185, and land on the source/drain contacts 120M, as shown in FIG. 1B. A conductive line 182, which may include a wire or trace, overlies and contacts the gate via 184 and the source/drain vias 183. The conductive line 182 may be or include a metal, such as copper, aluminum, tungsten, or other appropriate conductive material.

As shown in FIGS. 1B, 1F, the gate structures 200B-200E may straddle the hybrid fin 94 to form interconnection between transistors on either side of the hybrid fin 94. In some embodiments, one or more of the gate structures 200A-200E, such as the gate structure 200A, may be electrically isolated by a gate isolation structure 99. In some embodiments, the gate isolation structure 99 is or includes one or more dielectric materials, such as a high-k liner layer and a low-k fill layer.

Additional details pertaining to the fabrication of GAA devices are disclosed in U.S. Pat. No. 10,164,012, titled "Semiconductor Device and Manufacturing Method Thereof" and issued on Dec. 25, 2018, as well as in U.S. Pat. No. 10,361,278, titled "Method of Manufacturing a Semiconductor Device and a Semiconductor Device" and issued on Jul. 23, 2019, the disclosures of each which are hereby incorporated by reference in their respective entireties.

Figure 16A:
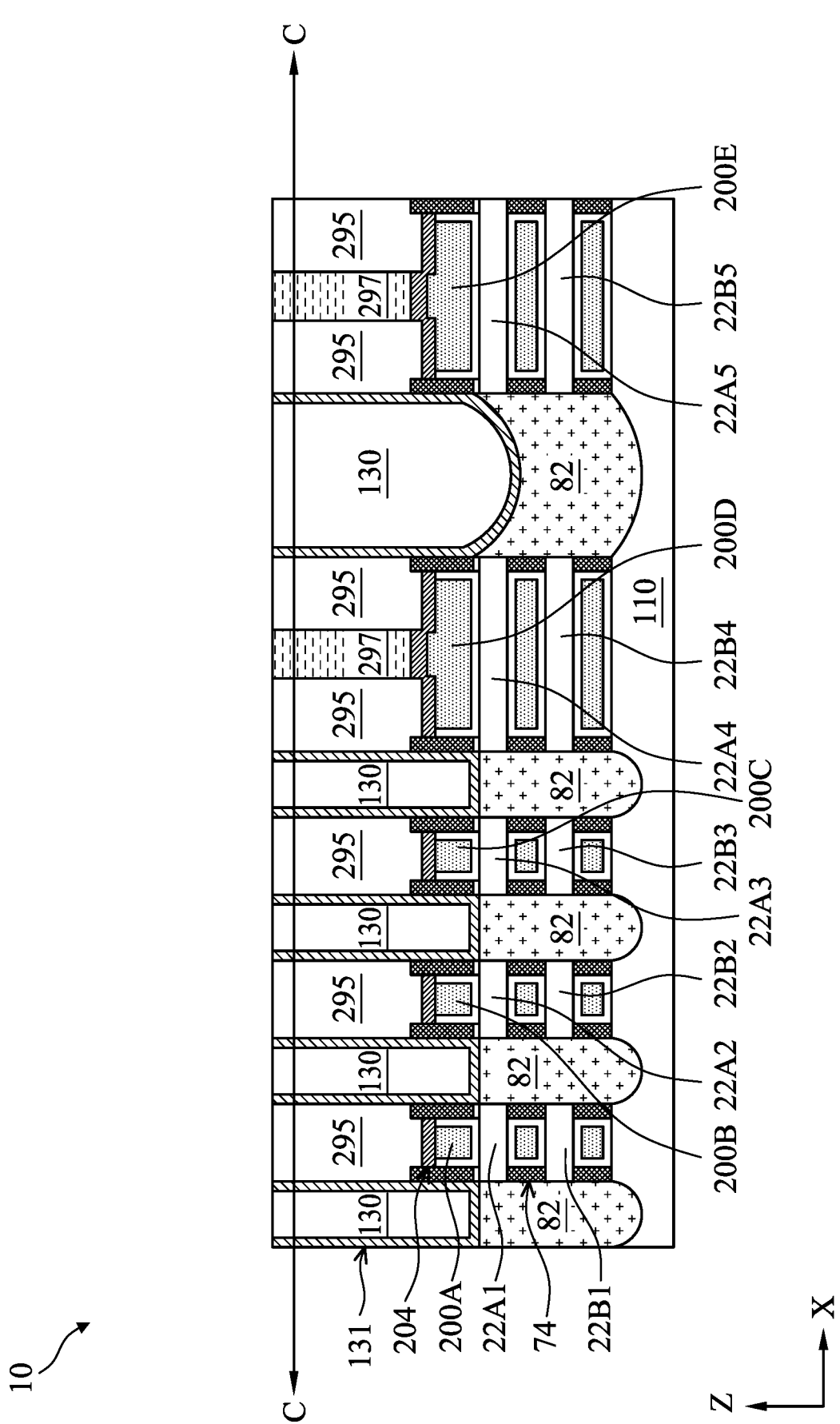
Figure 16B:
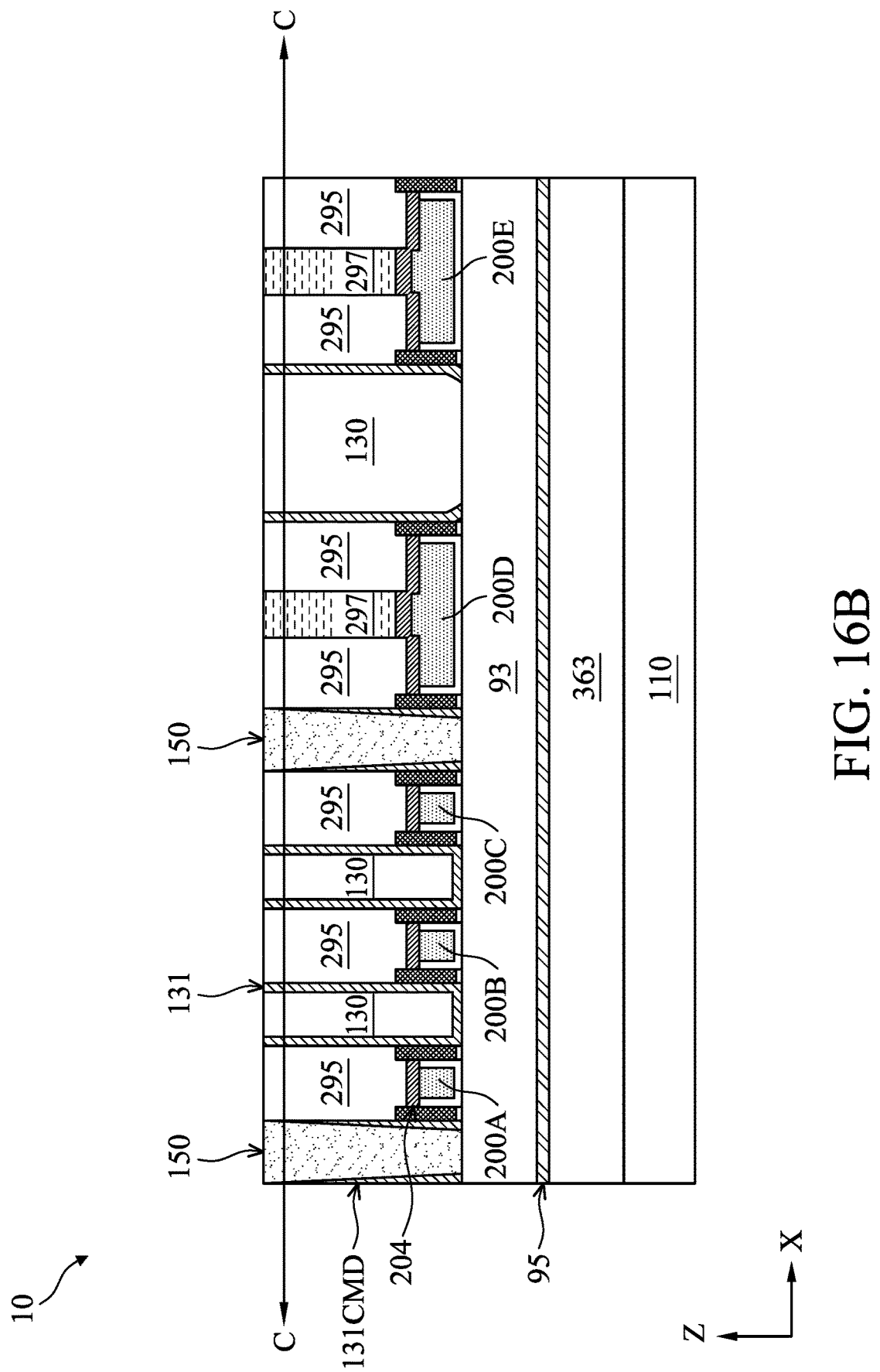
Figure 16C:
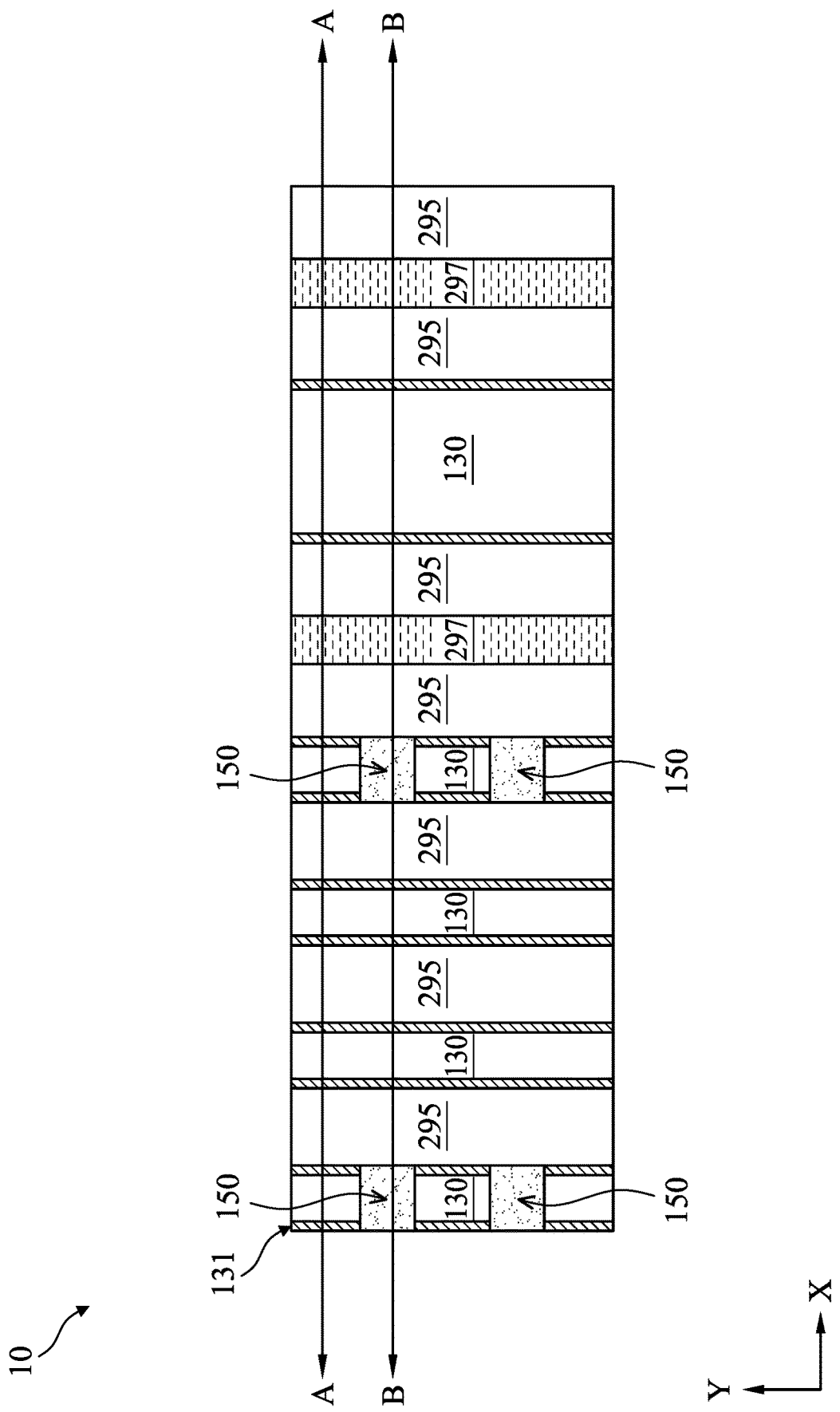
Figure 17:
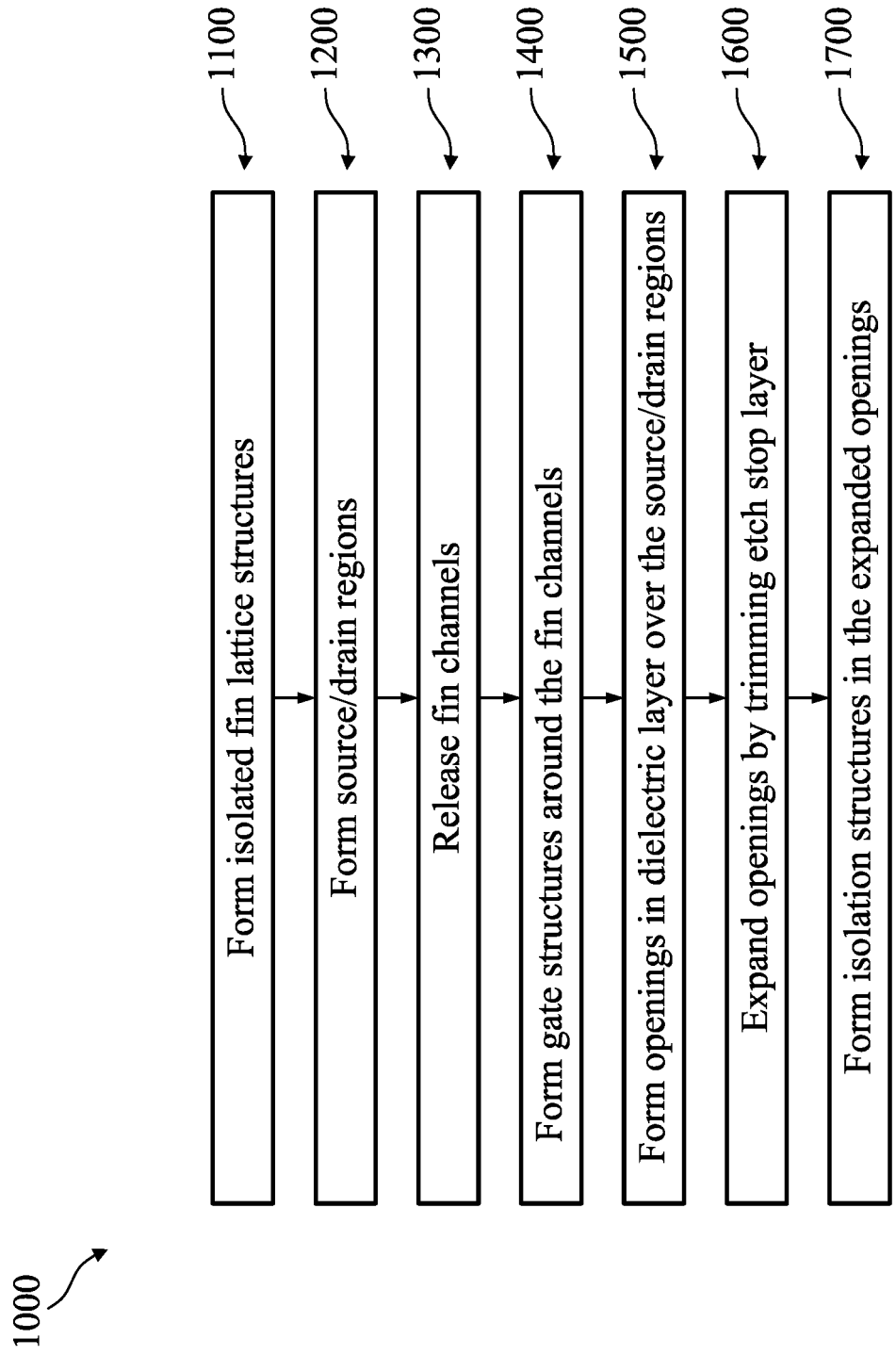
FIG. 17 is a flowchart illustrating a method of fabricating a semiconductor device according to various aspects of the present disclosure.

FIG. 17 illustrates a flowchart of a method 1000 for forming an IC device or a portion thereof from a workpiece, according to one or more aspects of the present disclosure. Method 1000 is merely an example and is not intended to limit the present disclosure to what is explicitly illustrated in method 1000. Additional acts can be provided before, during and after the method 1000, and some acts described can be replaced, eliminated, or moved around for additional embodiments of the methods. Not all acts are described herein in detail for reasons of simplicity. Method 1000 is described below in conjunction with fragmentary perspective and/or cross-sectional views of a workpiece, shown in FIGS. 2-16C, at different stages of fabrication according to embodiments of method 1000. For avoidance of doubt, throughout the figures, the X direction is perpendicular to the Y direction and the Z direction is perpendicular to both the X direction and the Y direction. It is noted that, because the workpiece may be fabricated into a semiconductor device, the workpiece may be referred to as the semiconductor device as the context requires.

FIGS. 2A through 11 are perspective views and cross-sectional views of intermediate stages in the manufacturing of nano-FETs, in accordance with some embodiments. FIGS. 2A, 3A, 4A, 5A, 6A, 7A, 8A, 9A, and 10A illustrate perspective views. FIGS. 2B, 3B, 4B, 5B, 6B, 7B, 8B, 9B, and 10B illustrate reference cross-section B-B' (gate cut) illustrated in FIGS. 2A, 3A, and 4A. FIGS. 4C, 5C, 6C, 7C, 8C, 9C, 10C and 11 illustrate reference cross-section C-C' (channel/fin cut) illustrated in FIG. 4A.

Figure 2B:
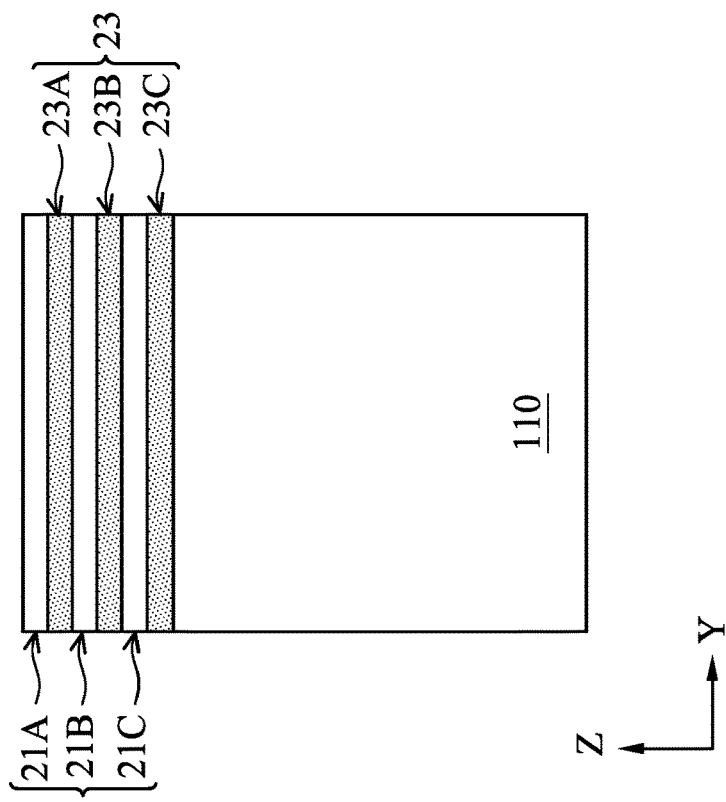
Figure 2A:
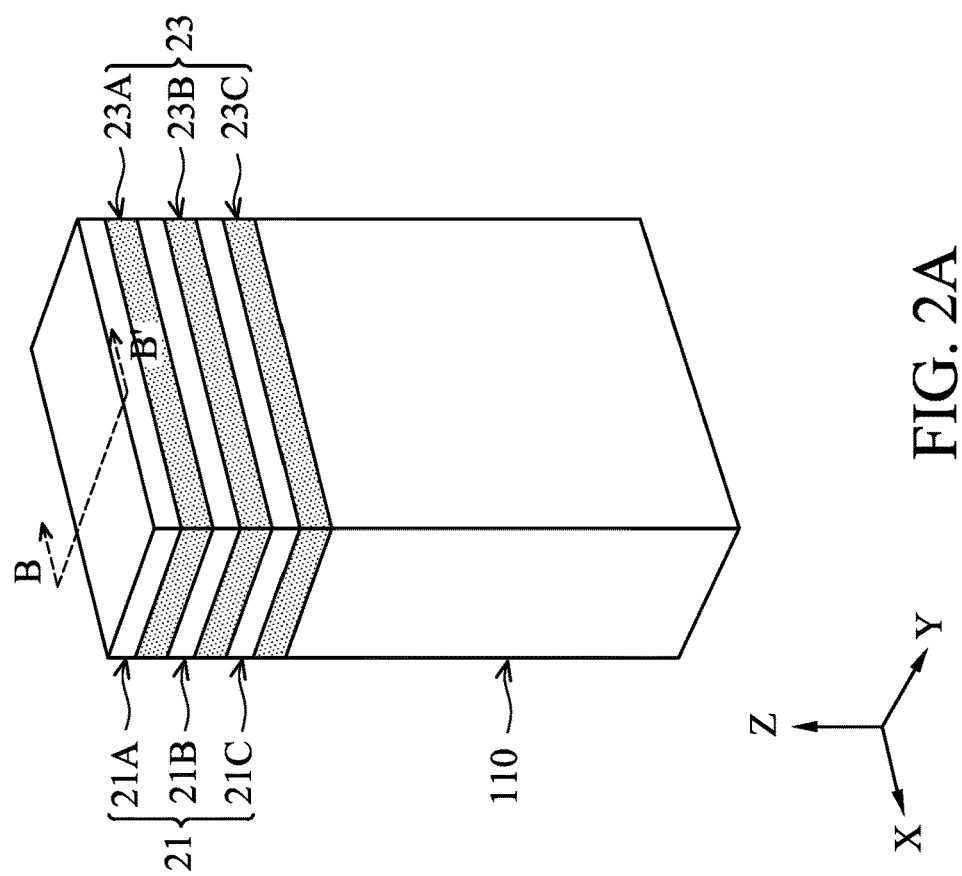

In FIG. 2A and FIG. 2B, a substrate 110 is provided. The substrate 110 may be a semiconductor substrate, such as a bulk semiconductor, or the like, which may be doped (e.g., with a p-type or an n-type dopant) or undoped. The semiconductor material of the substrate 110 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof. Other substrates, such as single-layer, multi-layered, or gradient substrates may be used.

Further in FIG. 2A and FIG. 2B, a multi-layer stack 25 or "lattice" is formed over the substrate 110 of alternating layers of first semiconductor layers 21A-21C (collectively referred to as first semiconductor layers 21) and second semiconductor layers 23A-23C (collectively referred to as second semiconductor layers 23). In some embodiments, the first semiconductor layers 21 may be formed of a first semiconductor material suitable for n-type nano-FETs, such as silicon, silicon carbide, or the like, and the second semiconductor layers 23 may be formed of a second semiconductor material suitable for p-type nano-FETs, such as silicon germanium or the like. Each of the layers of the multi-layer stack 25 may be epitaxially grown using a process such as chemical vapor deposition (CVD), atomic layer deposition (ALD), vapor phase epitaxy (VPE), molecular beam epitaxy (MBE), or the like.

Three layers of each of the first semiconductor layers 21 and the second semiconductor layers 23 are illustrated. In some embodiments, the multi-layer stack 25 may include one or two each or four or more each of the first semiconductor layers 21 and the second semiconductor layers 23. Although the multi-layer stack 25 is illustrated as including a second semiconductor layer 23C as the bottommost layer, in some embodiments, the bottommost layer of the multi-layer stack 25 may be a first semiconductor layer 21.

Due to high etch selectivity between the first semiconductor materials and the second semiconductor materials, the second semiconductor layers 23 of the second semiconductor material may be removed without significantly removing the first semiconductor layers 21 of the first semiconductor material, thereby allowing the first semiconductor layers 21 to be patterned to form channel regions of nano-FETs. In some embodiments, the first semiconductor layers 21 are removed and the second semiconductor layers 23 are patterned to form channel regions. The high etch selectivity allows the first semiconductor layers 21 of the first semiconductor material to be removed without significantly removing the second semiconductor layers 23 of the second semiconductor material, thereby allowing the second semiconductor layers 23 to be patterned to form channel regions of nano-FETs.

In FIG. 3A and FIG. 3B, fins 32 are formed in the substrate 110 and nanostructures 22, 24 are formed in the multi-layer stack 25 corresponding to act 1100 of FIG. 17. In some embodiments, the nanostructures 22, 24 and the fins 32 may be formed by etching trenches in the multi-layer stack 25 and the substrate 110. The etching may be any acceptable etch process, such as a reactive ion etch (RIE), neutral beam etch (NBE), the like, or a combination thereof. The etching may be anisotropic. First nanostructures 22A-22C (also referred to as "channels" below) are formed from the first semiconductor layers 21, and second nanostructures 24A-24C are formed from the second semiconductor layers 23. Distance CD1 between adjacent fins 32 and nanostructures 22, 24 may be from about 18 nm to about 100 nm. A portion of the device 10 is illustrated in FIGS. 3A and 3B including two fins 32 for simplicity of illustration. The device 10 shown in FIGS. 1A-1F is shown including three fins 322-324. The process 1000 illustrated in FIGS. 2A-16C may be extended to any number of fins, and is not limited to the two fins 32 shown in FIGS. 3A-16C nor to the three fins 322-324 shown in FIG. 1E.

The fins 32 and the nanostructures 22, 24 may be patterned by any suitable method. For example, one or more photolithography processes, including double-patterning or multi-patterning processes, may be used to form the fins 32 and the nanostructures 22, 24. Generally, double-patterning or multi-patterning processes combine photolithography and self-aligned processes, allowing for pitches smaller than what is otherwise obtainable using a single, direct photolithography process. As an example of one multi-patterning process, a sacrificial layer may be formed over a substrate and patterned using a photolithography process. Spacers are formed alongside the patterned sacrificial layer using a self-aligned process. The sacrificial layer is then removed, and the remaining spacers may then be used to pattern the fins 32.

FIGS. 3A and 3B illustrate the fins 32 having tapered sidewalls, such that a width of each of the fins 32 and/or the nanostructures 22, 24 continuously increases in a direction towards the substrate 110. In such embodiments, each of the nanostructures 22, 24 may have a different width and be trapezoidal in shape. In other embodiments, the sidewalls are substantially vertical (non-tapered), such that width of the fins 32 and the nanostructures 22, 24 is substantially similar, and each of the nanostructures 22, 24 is rectangular in shape.

In FIGS. 3A and 3B, isolation regions 36, which may be shallow trench isolation (STI) regions, are formed adjacent the fins 32. The isolation regions 36 may be formed by depositing an insulation material over the substrate 110, the fins 32, and nanostructures 22, 24, and between adjacent fins 32 and nanostructures 22, 24. The insulation material may be an oxide, such as silicon oxide, a nitride, the like, or a combination thereof, and may be formed by high-density plasma CVD (HDP-CVD), flowable CVD (FCVD), the like, or a combination thereof. In some embodiments, a liner (not separately illustrated) may first be formed along surfaces of the substrate 110, the fins 32, and the nanostructures 22, 24. Thereafter, a fill material, such as those discussed above may be formed over the liner.

The insulation material undergoes a removal process, such as a chemical mechanical polish (CMP), an etch-back process, combinations thereof, or the like, to remove excess insulation material over the nanostructures 22, 24. Top surfaces of the nanostructures 22, 24 may be exposed and level with the insulation material after the removal process is complete.

The insulation material is then recessed to form the isolation regions 36. After recessing, the nanostructures 22, 24 and upper portions of the fins 32 may protrude from between neighboring isolation regions 36. The isolation regions 36 may have top surfaces that are flat as illustrated, convex, concave, or a combination thereof. In some embodiments, the isolation regions 36 are recessed by an acceptable etching process, such as an oxide removal using, for example, dilute hydrofluoric acid (dHF), which is selective to the insulation material and leaves the fins 32 and the nanostructures 22, 24 substantially unaltered.

FIGS. 2A through 3B illustrate one embodiment (e.g., etch last) of forming the fins 32 and the nanostructures 22, 24. In some embodiments, the fins 32 and/or the nanostructures 22, 24 are epitaxially grown in trenches in a dielectric layer (e.g., etch first). The epitaxial structures may comprise the alternating semiconductor materials discussed above, such as the first semiconductor materials and the second semiconductor materials.

Further in FIG. 3A and FIG. 3B, appropriate wells (not separately illustrated) may be formed in the fins 32, the nanostructures 22, 24, and/or the isolation regions 36. Using masks, an n-type impurity implant may be performed in p-type regions of the substrate 110, and a p-type impurity implant may be performed in n-type regions of the substrate 110. Example n-type impurities may include phosphorus, arsenic, antimony, or the like. Example p-type impurities may include boron, boron fluoride, indium, or the like. An anneal may be performed after the implants to repair implant damage and to activate the p-type and/or n-type impurities. In some embodiments, in situ doping during epitaxial growth of the fins 32 and the nanostructures 22, 24 may obviate separate implantations, although in situ and implantation doping may be used together.

Figure 4A:
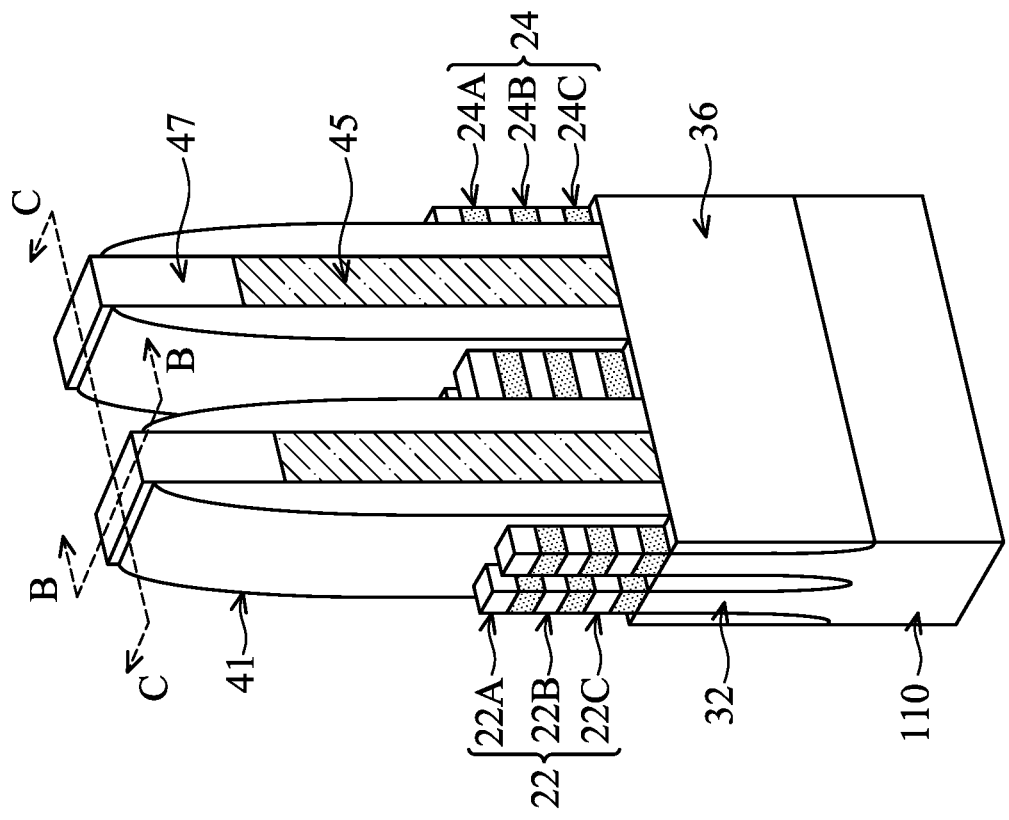
Figure 4C:
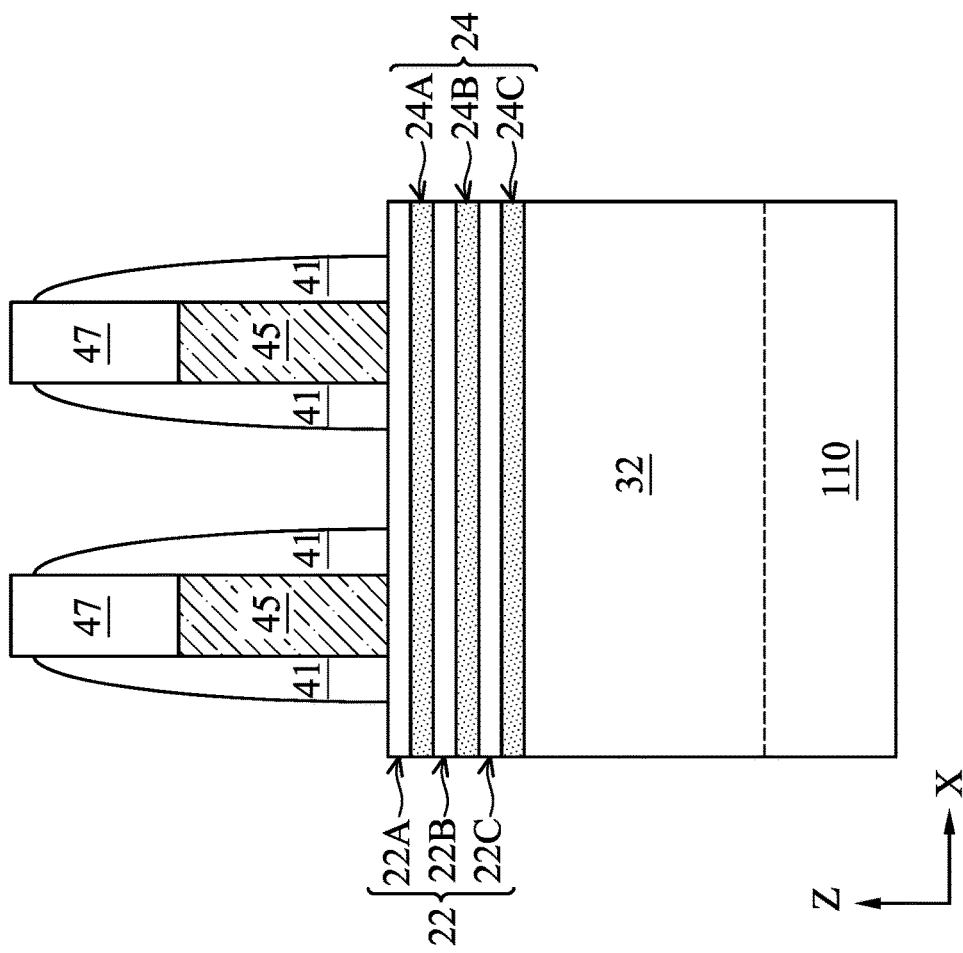
Figure 4B:
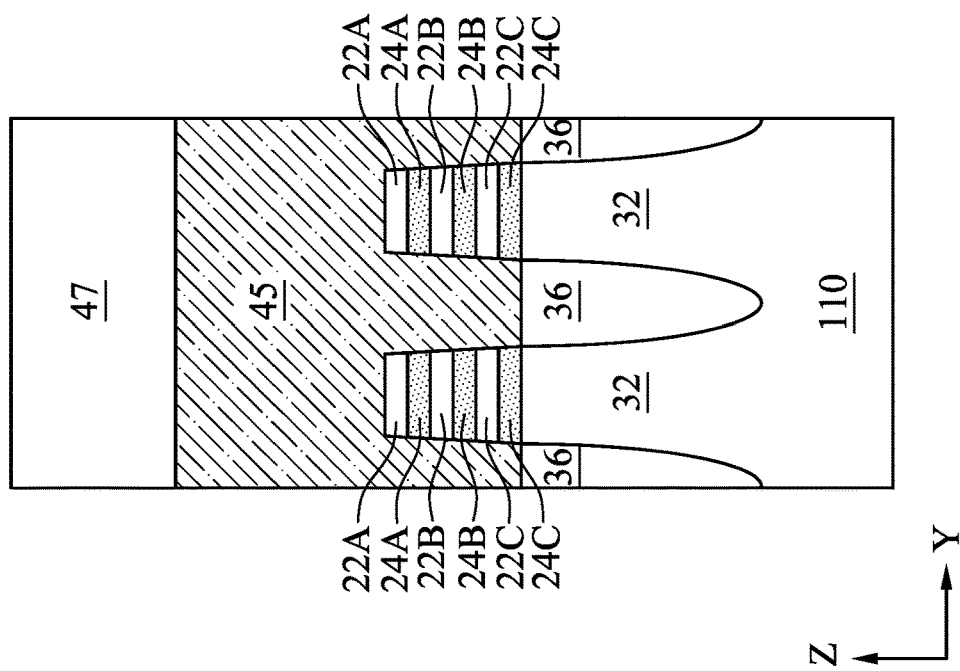

In FIGS. 4A-4C, dummy gate structures 40 are formed over the fins 32 and/or the nanostructures 22, 24. A dummy gate layer 45 is formed over the fins 32 and/or the nanostructures 22, 24. The dummy gate layer 45 may be made of materials that have a high etching selectivity versus the isolation regions 36. The dummy gate layer 45 may be a conductive, semiconductive, or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 45 may be deposited by physical vapor deposition (PVD), CVD, sputter deposition, or other techniques for depositing the selected material. A mask layer 47 is formed over the dummy gate layer 45, and may include, for example, silicon nitride, silicon oxynitride, or the like. In some embodiments, a gate dielectric layer (not illustrated for simplicity) is formed before the dummy gate layer 45 between the dummy gate layer 45 and the fins 32 and/or the nanostructures 22, 24.

A spacer layer 41 is formed over sidewalls of the mask layer 47 and the dummy gate layer 45. The spacer layer 41 is made of an insulating material, such as silicon nitride, silicon oxide, silicon carbo-nitride, silicon oxynitride, silicon oxy carbo-nitride, or the like, and may have a single-layer structure or a multi-layer structure including a plurality of dielectric layers, in accordance with some embodiments. The spacer layer 41 may be formed by depositing a spacer material layer (not shown) over the mask layer 47 and the dummy gate layer 45. Portions of the spacer material layer between dummy gate structures 40 are removed using an anisotropic etching process, in accordance with some embodiments.

FIGS. 4A-4C illustrate one process for forming the spacer layer 41. In some embodiments, the spacer layer 41 is formed alternately or additionally after removal of the dummy gate layer 45. In such embodiments, the dummy gate layer 45 is removed, leaving an opening, and the spacer layer 41 may be formed by conformally coating material of the spacer layer 41 along sidewalls of the opening. The conformally coated material may then be removed from the bottom of the opening corresponding to the top surface of the uppermost channel, e.g., the channel 22A, prior to forming an active gate, such as any of the gate structures 200A-200E.

Figure 5A:
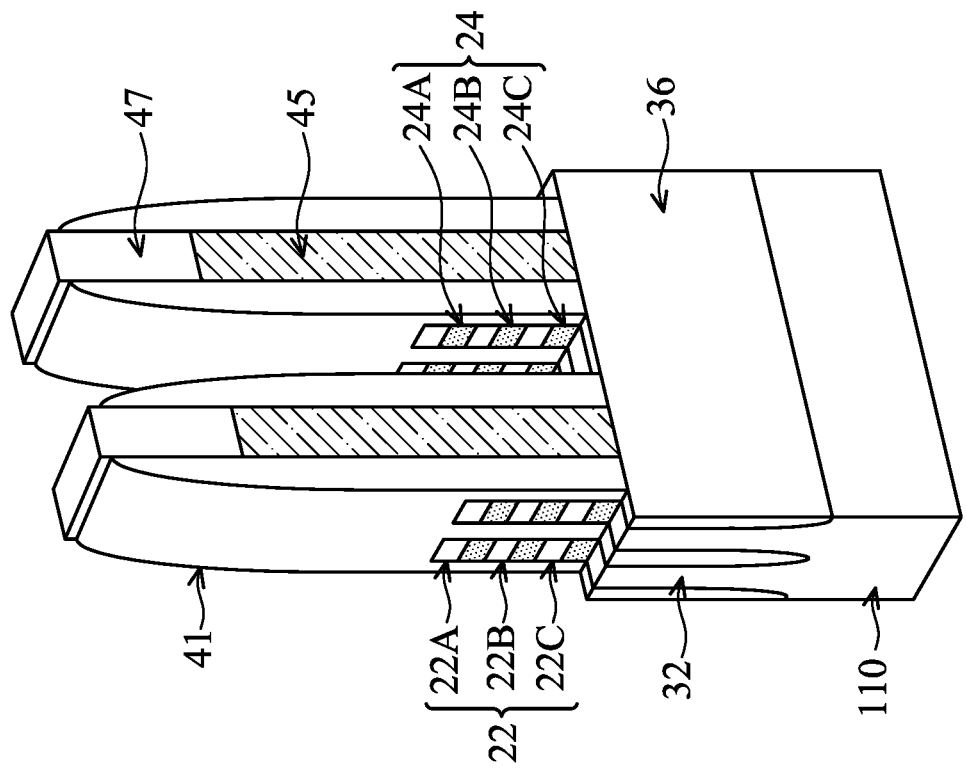
Figure 5C:
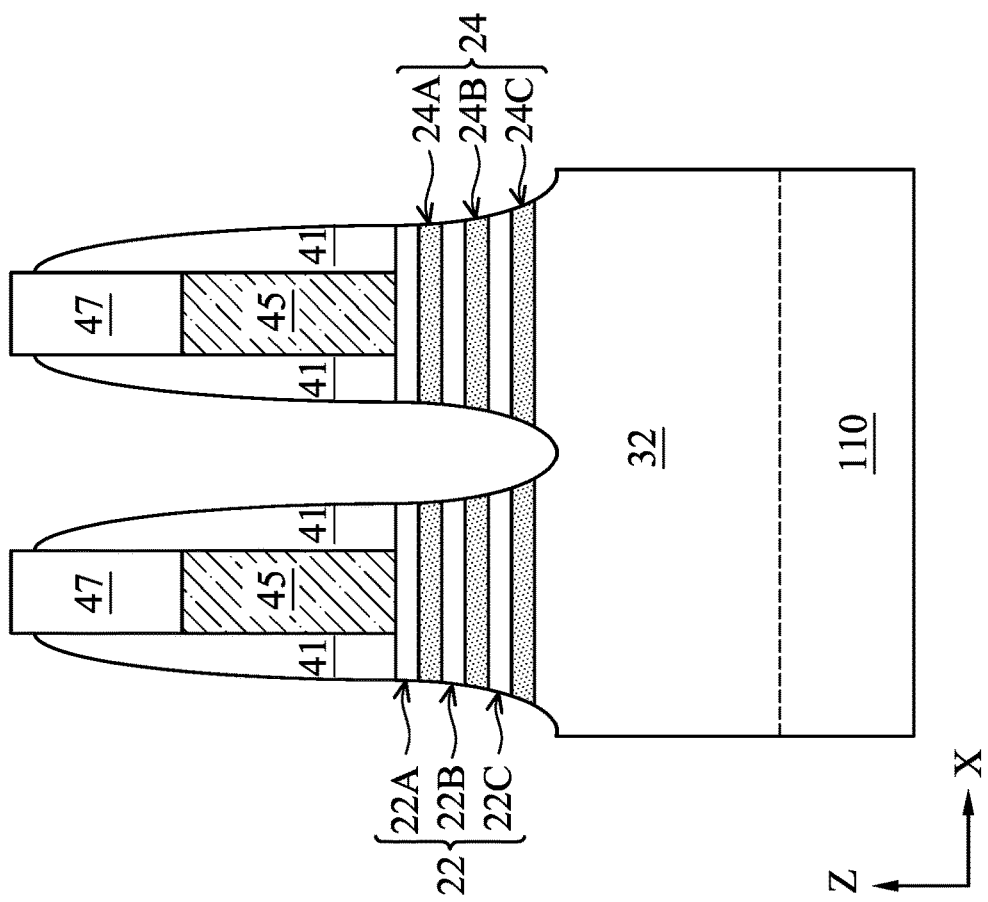
Figure 5B:
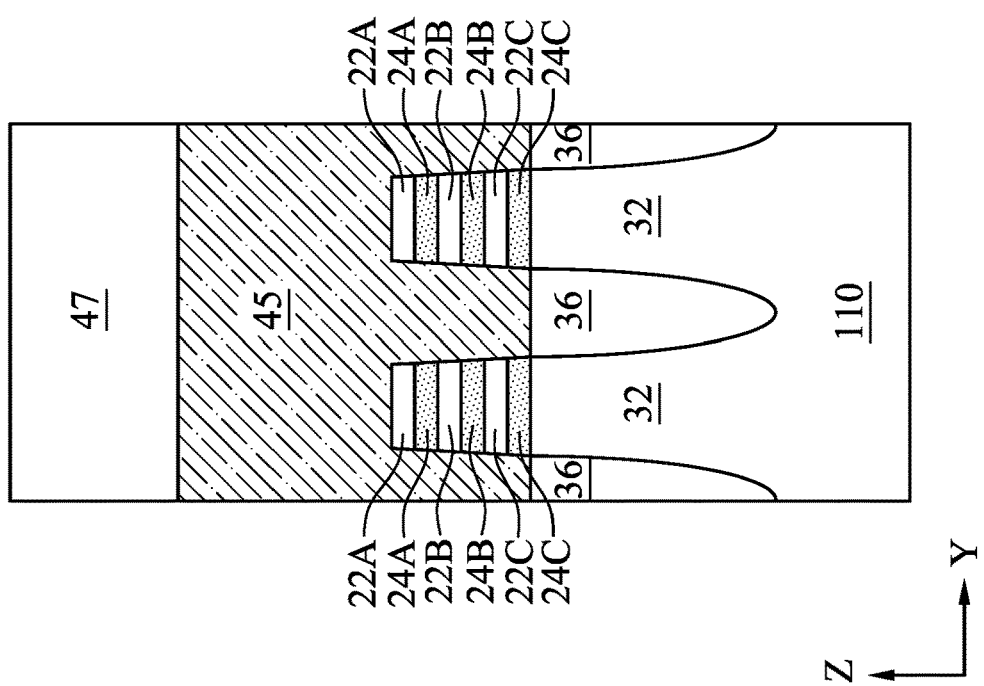

In FIGS. 5A-5C, an etching process is performed to etch the portions of protruding fins 32 and/or nanostructures 22, 24 that are not covered by dummy gate structures 40, resulting in the structure shown. The recessing may be anisotropic, such that the portions of fins 32 directly underlying dummy gate structures 40 and the spacer layer 41 are protected, and are not etched. The top surfaces of the recessed fins 32 may be substantially coplanar with the top surfaces of the isolation regions 36 as shown, in accordance with some embodiments. The top surfaces of the recessed fins 32 may be lower than the top surfaces of the isolation regions 36, in accordance with some other embodiments. FIG. 5C shows two vertical stacks of nanostructures 22, 24 following the etching process for simplicity. FIGS. 1B, 1D, 1F show five vertical stacks of nanostructures 22 (nanostructures 24 are replaced by gate structures 200A-200E). In general, the etching process may be used to form any number of vertical stacks of nanostructures 22, 24 over the fins 32 (or over the fins 322-324).

Figure 6A:
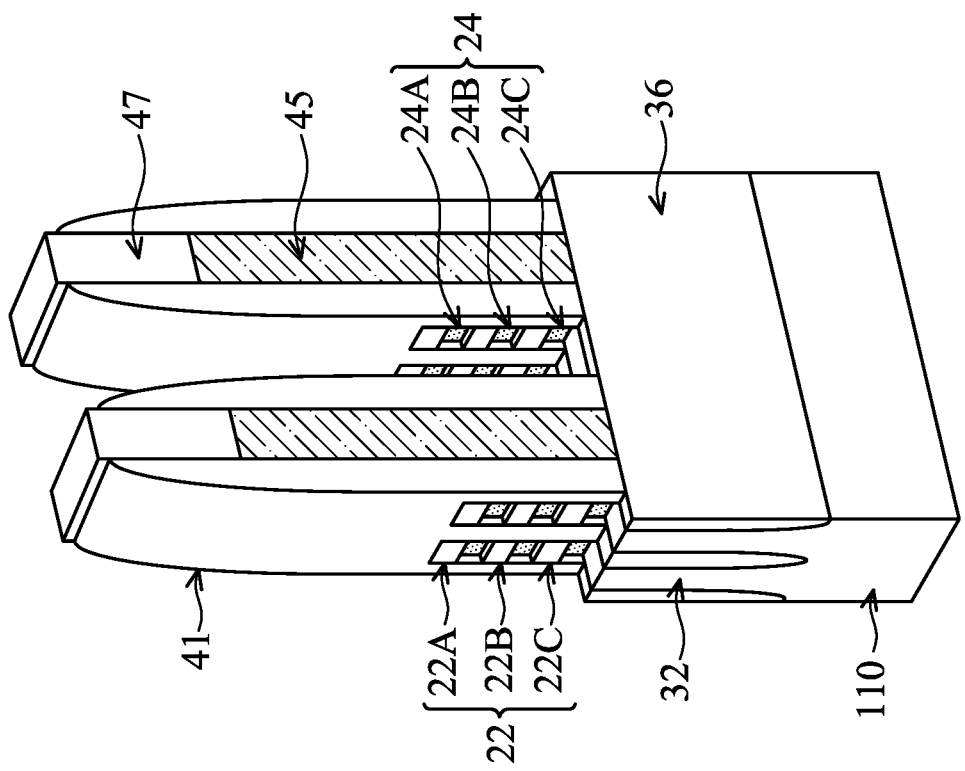
Figure 6C:
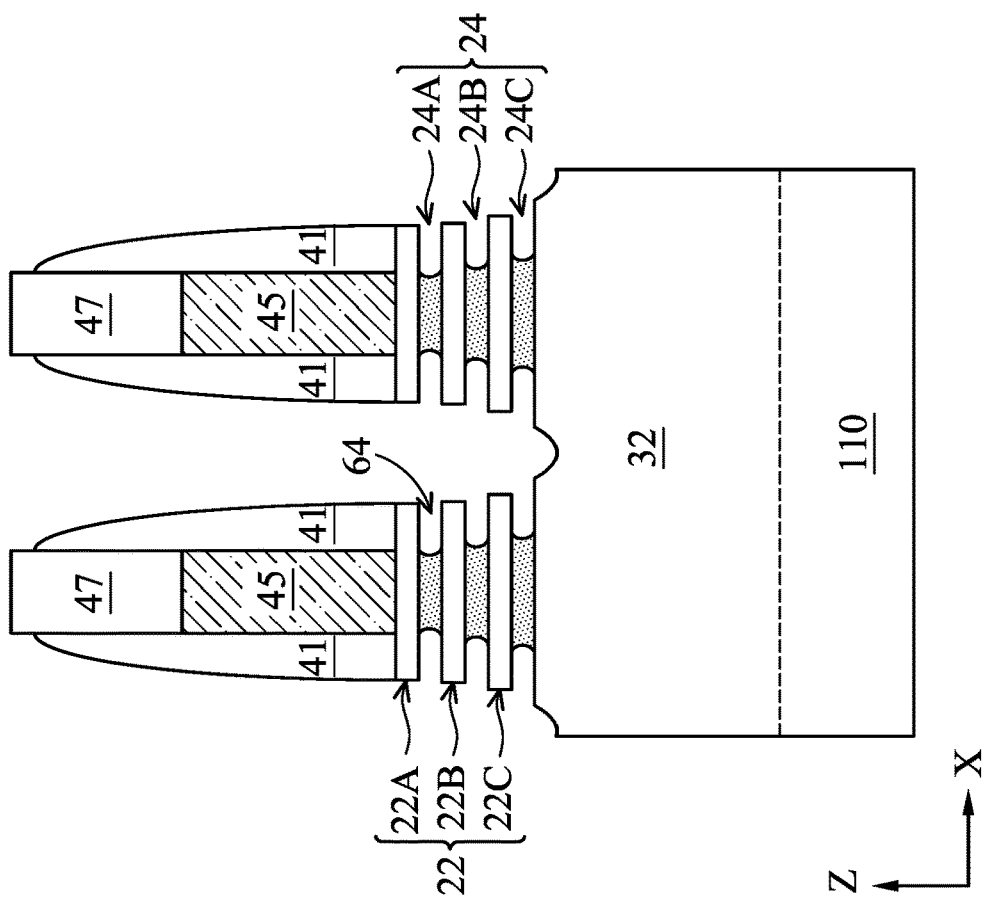
Figure 6B:
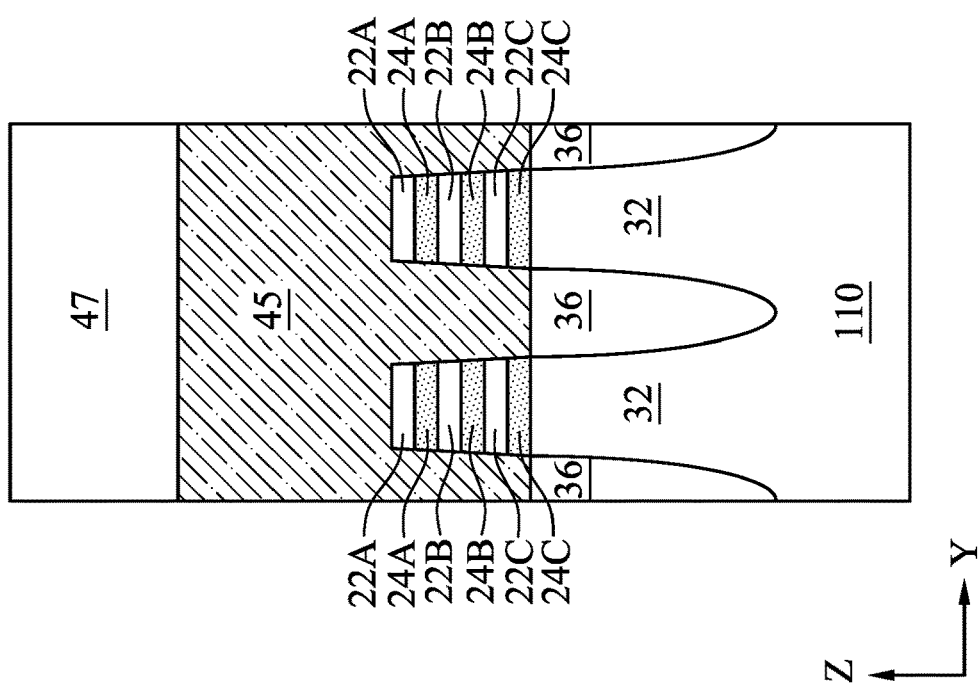

FIGS. 6A-6C and 7A-7C illustrate formation of inner spacers 74. A selective etching process is performed to recess end portions of the nanostructures 24 exposed by openings in the spacer layer 41 without substantially attacking the nanostructures 22. After the selective etching process, recesses 64 are formed in the nanostructures 24 at locations where the removed end portions used to be. The resulting structure is shown in FIGS. 6A-6C.

Figure 7A:
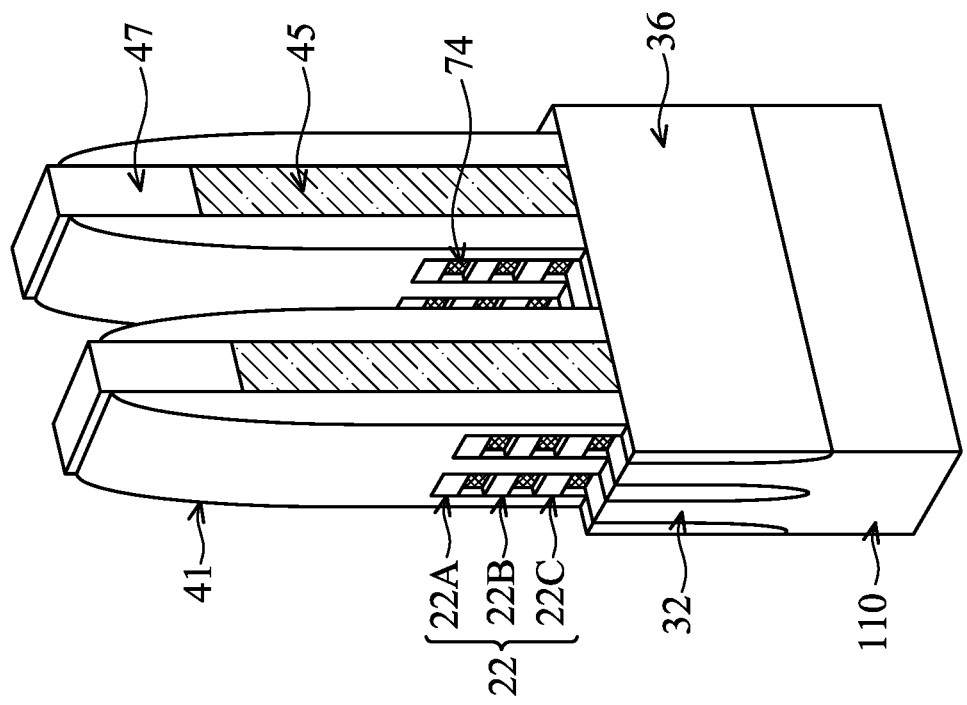
Figure 7C:
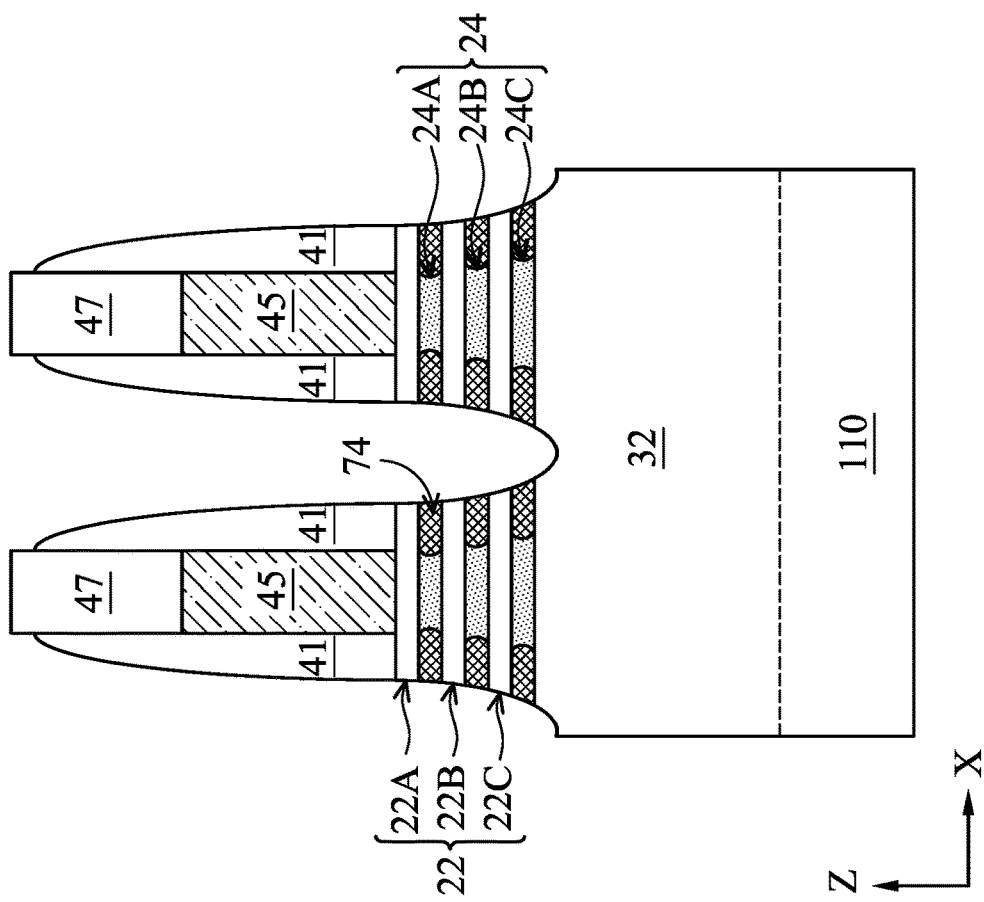
Figure 7B:
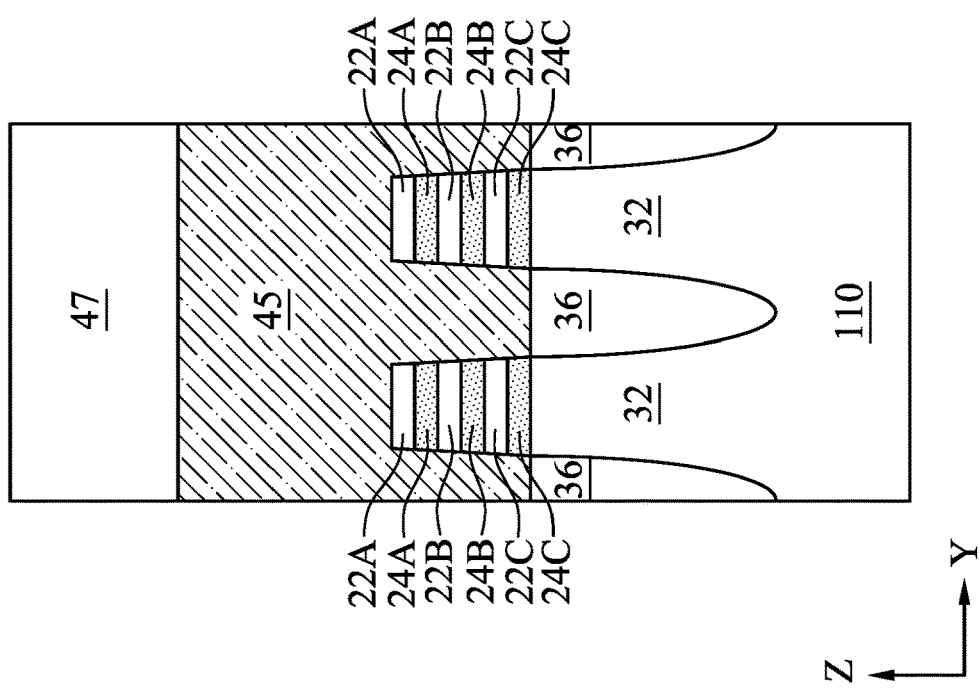

Next, an inner spacer layer is formed to fill the recesses 64 in the nanostructures 22 formed by the previous selective etching process. The inner spacer layer may be a suitable dielectric material, such as silicon carbon nitride (SiCN), silicon oxycarbonitride (SiOCN), or the like, formed by a suitable deposition method such as PVD, CVD, ALD, or the like. An etching process, such as an anisotropic etching process, is performed to remove portions of the inner spacer layers disposed outside the recesses in the nanostructures 24. The remaining portions of the inner spacer layers (e.g., portions disposed inside the recesses 64 in the nanostructures 24) form the inner spacers 74. The resulting structure is shown in FIGS. 7A-7C.

Figure 8A:
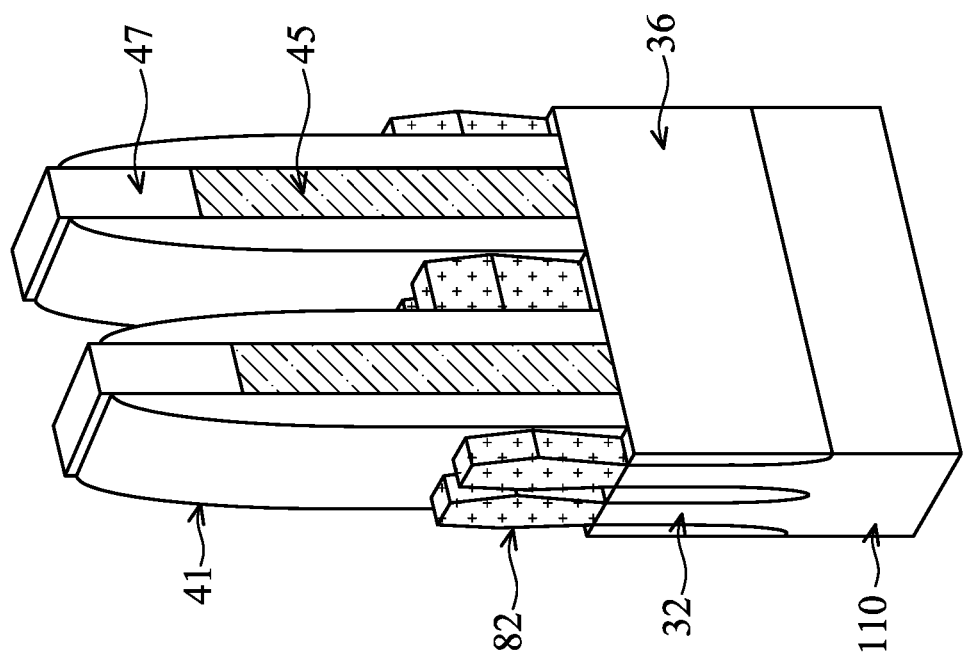
Figure 8C:
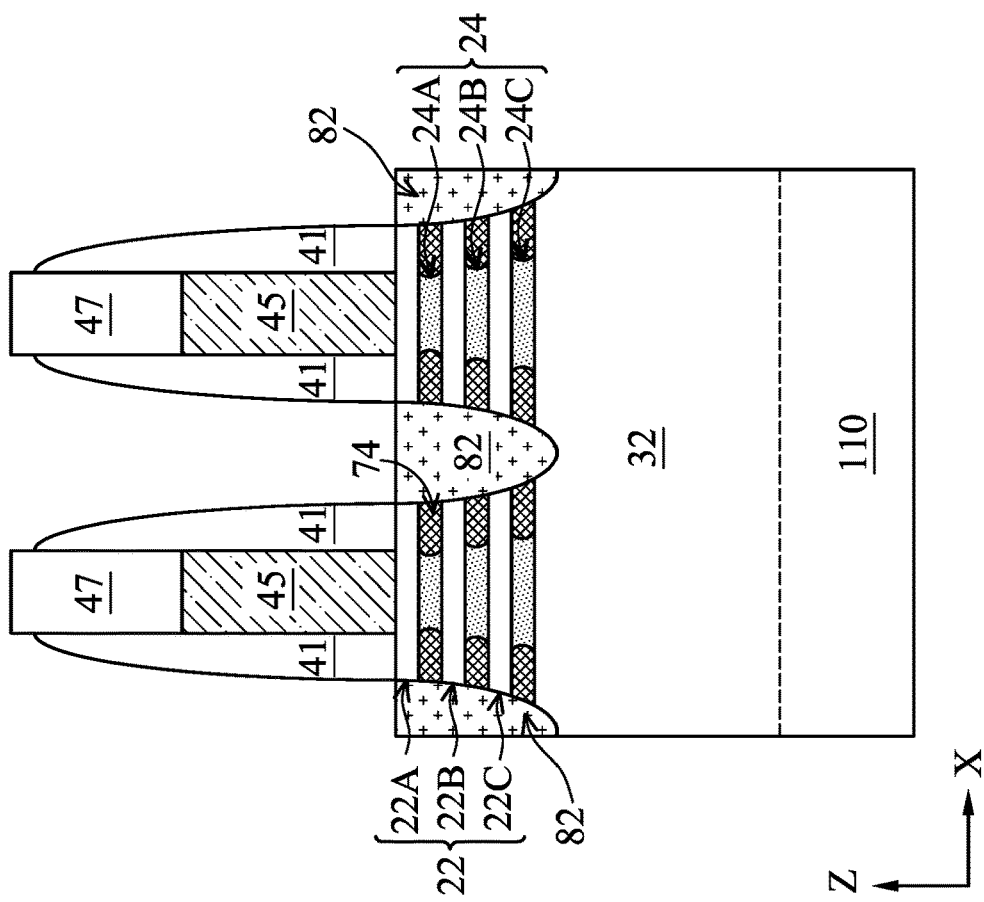
Figure 8B:
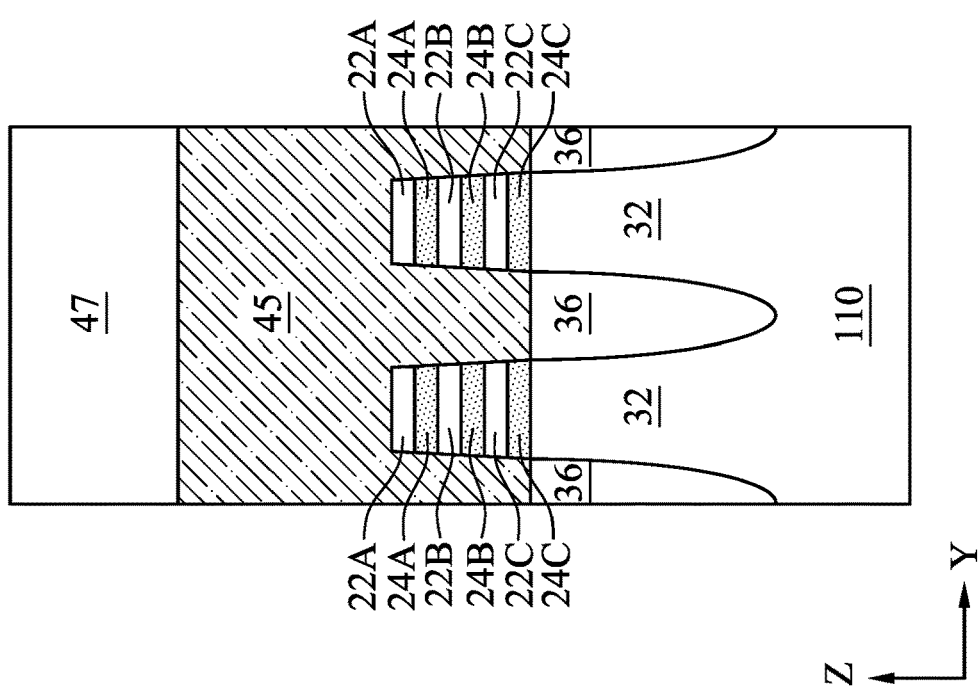

FIGS. 8A-8C illustrate formation of source/drain regions 82 corresponding to act 1200 of FIG. 17. In the illustrated embodiment, the source/drain regions 82 are epitaxially grown from epitaxial material(s). In some embodiments, the source/drain regions 82 exert stress in the respective channels 22A-22C, thereby improving performance. The source/drain regions 82 are formed such that each dummy gate structure 40 is disposed between respective neighboring pairs of the source/drain regions 82. In some embodiments, the spacer layer 41 separates the source/drain regions 82 from the dummy gate layer 45 by an appropriate lateral distance to prevent electrical bridging to subsequently formed gates of the resulting device.

The source/drain regions 82 may include any acceptable material, such as appropriate for n-type or p-type devices. For n-type devices, the source/drain regions 82 include materials exerting a tensile strain in the channel regions, such as silicon, SiC, SiCP, SiP, or the like, in some embodiments. When p-type devices are formed, the source/drain regions 82 include materials exerting a compressive strain in the channel regions, such as SiGe, SiGeB, Ge, GeSn, or the like, in accordance with certain embodiments. The source/drain regions 82 may have surfaces raised from respective surfaces of the fins and may have facets. Neighboring source/drain regions 82 may merge in some embodiments to form a singular source/drain region 82 adjacent two neighboring fins 32.

The source/drain regions 82 may be implanted with dopants followed by an anneal. The source/drain regions may have an impurity concentration of between about $10^{19}$ cm$^{-3}$ and about $10^{21}$ cm$^{-3}$. N-type and/or p-type impurities for source/drain regions 82 may be any of the impurities previously discussed. In some embodiments, the source/drain regions 82 are in situ doped during growth. A contact etch stop layer (CESL) 131 and interlayer dielectric (ILD) 130, shown in FIG. 11, may then be formed covering the dummy gate structures 40 and the source/drain regions 82. The CESL 131 and ILD 130 are omitted from FIGS. 8A-10C for simplicity of illustration.

Figure 9A:
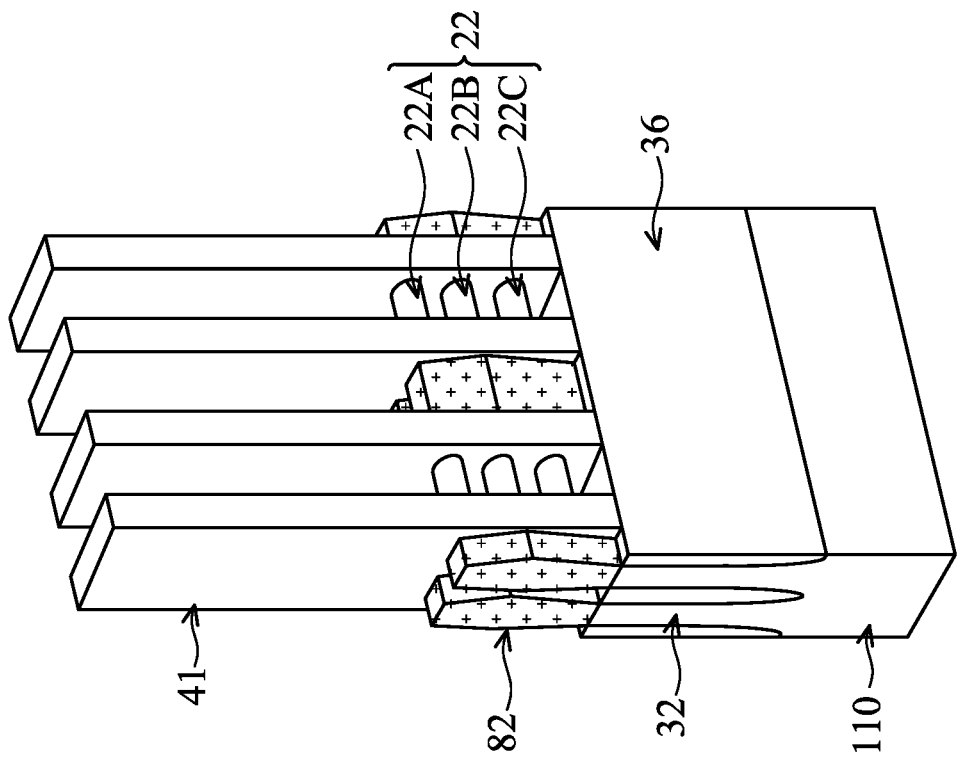
Figure 9C:
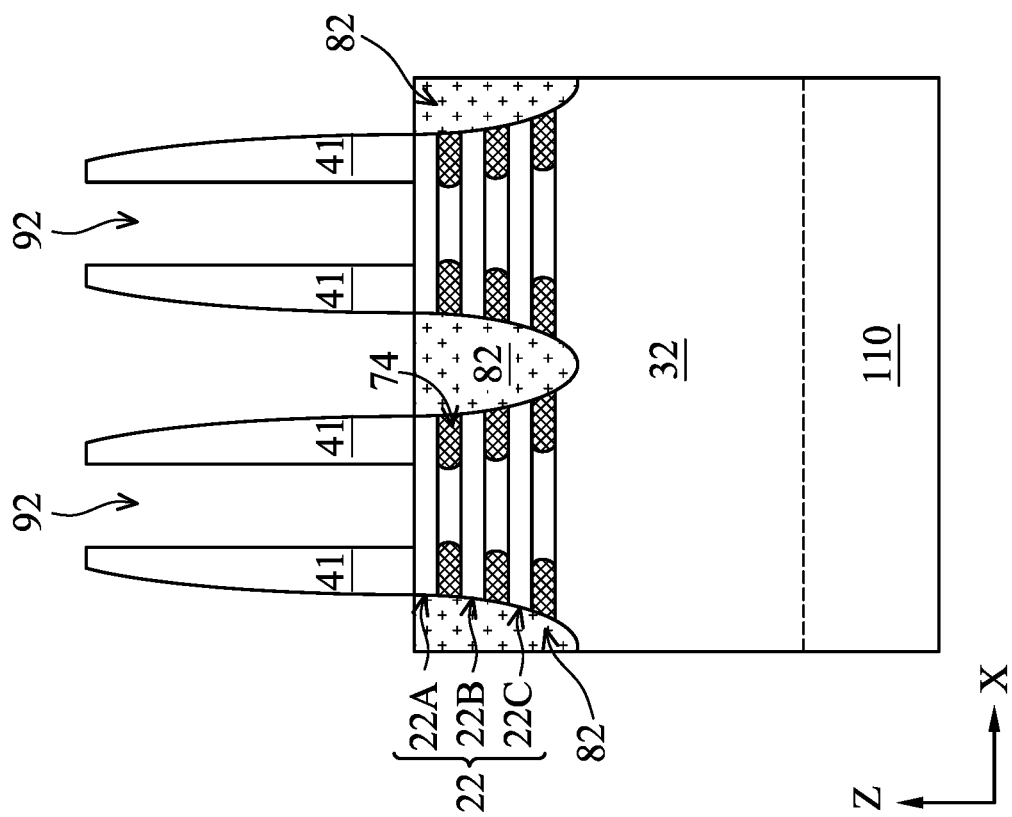
Figure 9B:
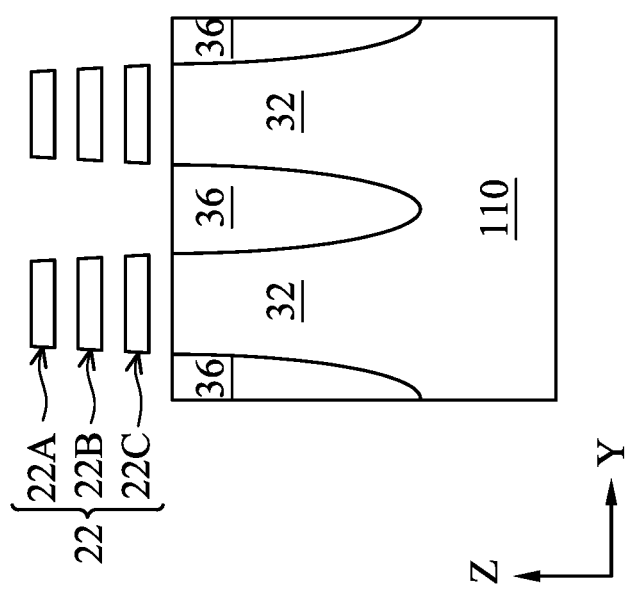

FIG. 9A, FIG. 9B, and FIG. 9C illustrate release of fin channels 22A-22C by removal of the nanostructures 24A-24C, the mask layer 47, and the dummy gate layer 45, which corresponds to act 1300 of FIG. 17. A planarization process, such as a CMP, is performed to level the top surfaces of the dummy gate layer 45 and gate spacer layer 41. The planarization process may also remove the mask layer 47 (see FIG. 8A) on the dummy gate layer 45, and portions of the gate spacer layer 41 along sidewalls of the mask layer 47. Accordingly, the top surfaces of the dummy gate layer 45 are exposed.

Next, the dummy gate layer 45 is removed in an etching process, so that recesses 92 are formed. In some embodiments, the dummy gate layer 45 is removed by an anisotropic dry etch process. For example, the etching process may include a dry etch process using reaction gas(es) that selectively etch the dummy gate layer 45 without etching the spacer layer 41. The dummy gate dielectric, when present, may be used as an etch stop layer when the dummy gate layer 45 is etched. The dummy gate dielectric may then be removed after the removal of the dummy gate layer 45.

The nanostructures 24 are removed to release the nanostructures 22. After the nanostructures 24 are removed, the nanostructures 22 form a plurality of nanosheets that extend horizontally (e.g., parallel to a major upper surface of the substrate 110). The nanosheets may be collectively referred to as the channels 22 of the GAA devices 20A-20E formed.

In some embodiments, the nanostructures 24 are removed by a selective etching process using an etchant that is selective to the material of the nanostructures 24, such that the nanostructures 24 are removed without substantially attacking the nanostructures 22. In some embodiments, the etching process is an isotropic etching process using an etching gas, and optionally, a carrier gas, where the etching gas comprises F2 and HF, and the carrier gas may be an inert gas such as Ar, He, N2, combinations thereof, or the like.

In some embodiments, the nanostructures 24 are removed and the nanostructures 22 are patterned to form channel regions of both PFETs and NFETs. However, in some embodiments the nanostructures 24 may be removed and the nanostructures 22 may be patterned to form channel regions of NFETs, and nanostructures 22 may be removed and the nanostructures 24 may be patterned to form channel regions of PFETs. In some embodiments, the nanostructures 22 may be removed and the nanostructures 24 may be patterned to form channel regions of NFETs, and the nanostructures 24 may be removed and the nanostructures 22 may be patterned to form channel regions of PFETs. In some embodiments, the nanostructures 22 may be removed and the nanostructures 24 may be patterned to form channel regions of both PFETs and NFETs.

In some embodiments, the nanosheets 22 are reshaped (e.g. thinned) by a further etching process to improve gate fill window. The reshaping may be performed by an isotropic etching process selective to the nanosheets 22. After reshaping, the nanosheets 22 may exhibit the dog bone shape in which middle portions of the nanosheets 22 are thinner than peripheral portions of the nanosheets 22 along the X direction.

Figure 10A:
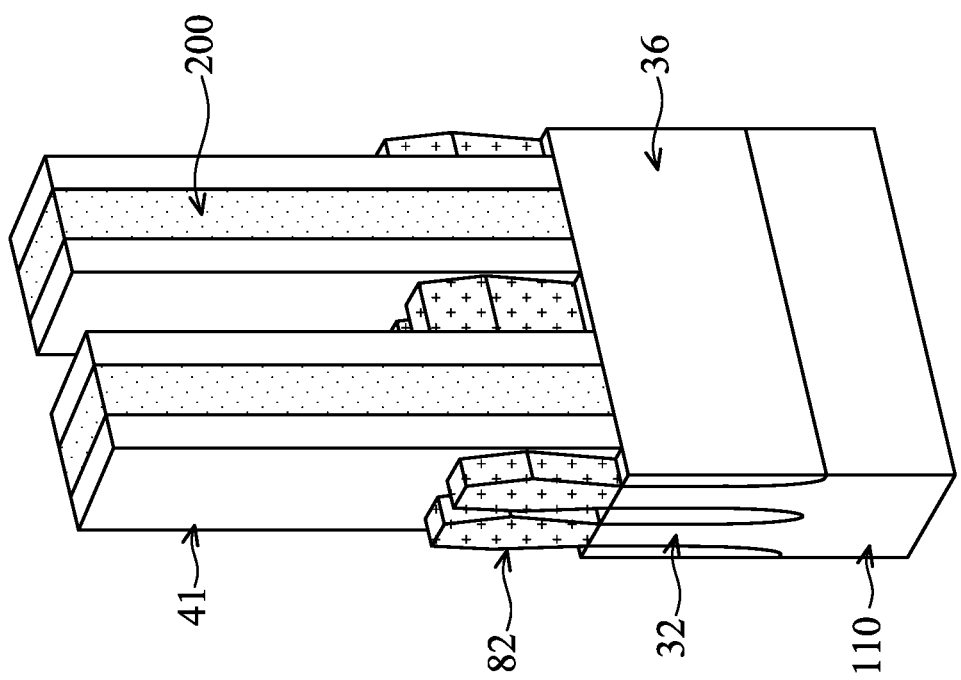
Figure 10C:
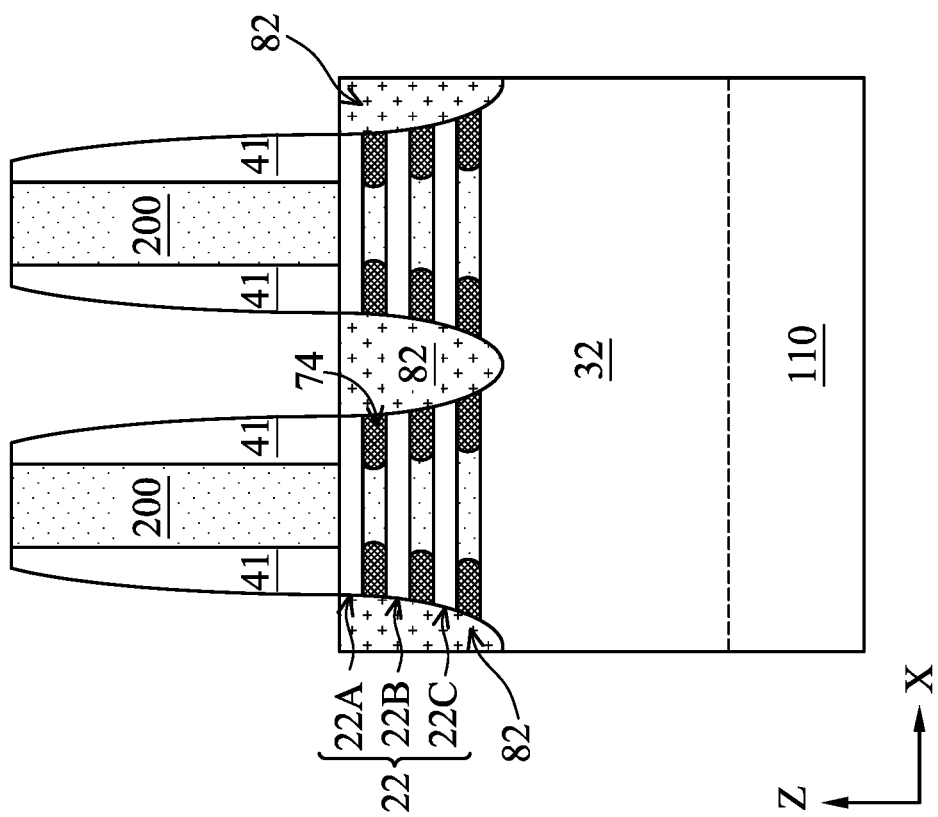
Figure 10B:
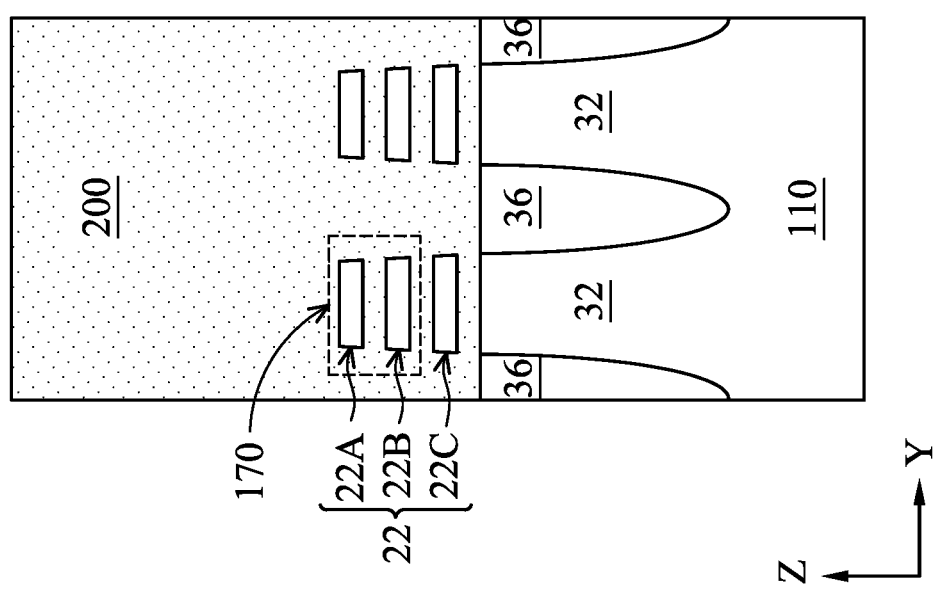
Figure 11:
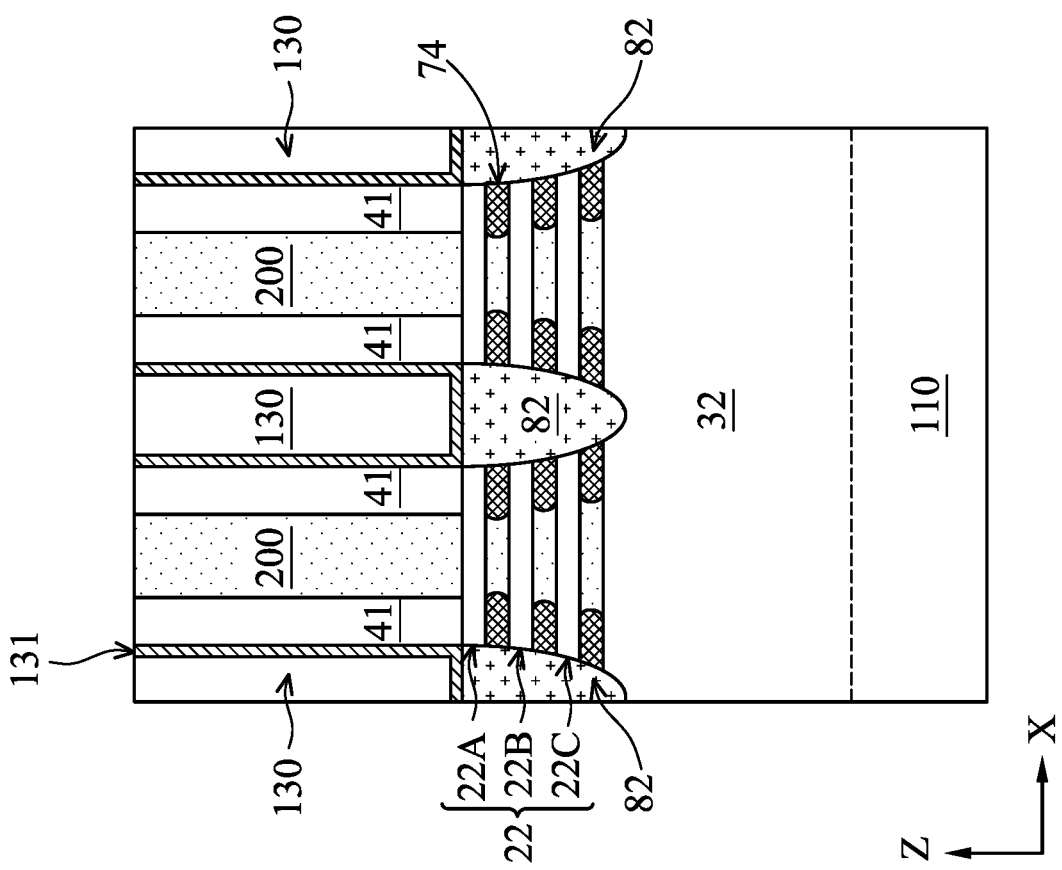
Figure 12:
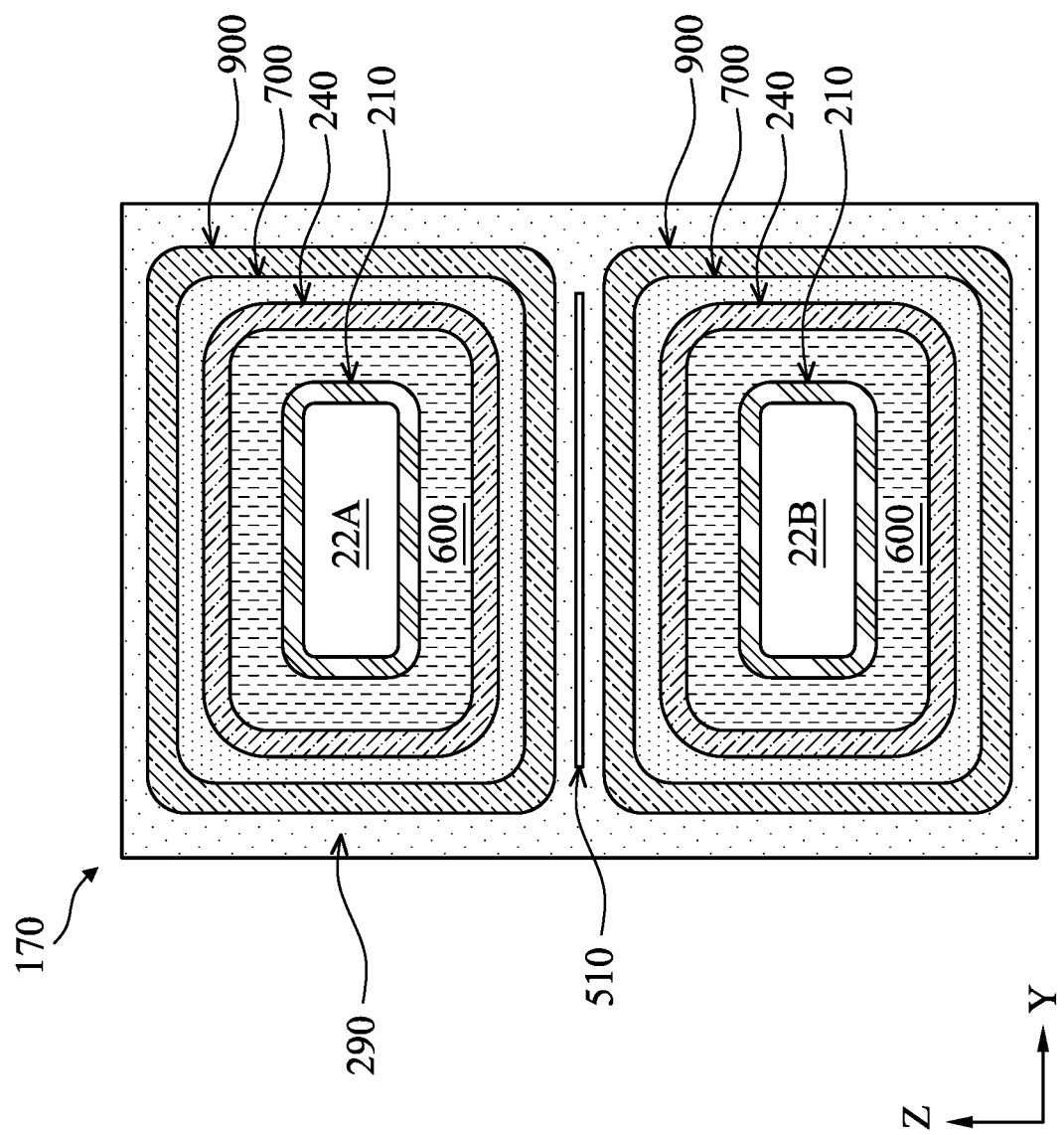

In FIGS. 10A-10C, replacement gates 200 are formed, corresponding to act 1400 of FIG. 17. FIG. 12 is a detailed view of the region 170 of FIG. 10B corresponding to a portion of the gate structure 200. The gate structure 200 generally includes the interfacial layer (IL, or "first IL" below) 210, at least one gate dielectric layer 600, the work function metal layer 900, and the gate fill layer 290. In some embodiments, each replacement gate 200 further includes at least one of a second interfacial layer 240 or a second work function layer 700.

With reference to FIG. 12, in some embodiments, the first IL 210 includes an oxide of the semiconductor material of the substrate 110, e.g. silicon oxide. In other embodiments, the first IL 210 may include another suitable type of dielectric material. The first IL 210 has a thickness in a range between about 5 angstroms and about 50 angstroms.

Still referring to FIG. 12, the gate dielectric layer 600 is formed over the first IL 210. In some embodiments, an atomic layer deposition (ALD) process is used to form the gate dielectric layer 600 to control thickness of the deposited gate dielectric layer 600 with precision. In some embodiments, the ALD process is performed using between about 40 and 80 deposition cycles, at a temperature range between about 200 degrees Celsius and about 300 degrees Celsius. In some embodiments, the ALD process uses HfCl4 and/or H2O as precursors. Such an ALD process may form the first gate dielectric layer 600 to have a thickness in a range between about 10 angstroms and about 100 angstroms.

In some embodiments, the gate dielectric layer 600 includes a high-k dielectric material, which may refer to dielectric materials having a high dielectric constant that is greater than a dielectric constant of silicon oxide (k≈3.9). Exemplary high-k dielectric materials include $HfO_2$, HfSiO, HfSiON, HfTaO, HfTiO, HfZrO, $ZrO_2$, $Ta_2O_5$, or combinations thereof. In other embodiments, the gate dielectric layer 600 may include a non-high-k dielectric material such as silicon oxide. In some embodiments, the gate dielectric layer 600 includes more than one high-k dielectric layer, of which at least one includes dopants, such as lanthanum, magnesium, yttrium, or the like, which may be driven in by an annealing process to modify threshold voltage of the GAA devices 20A-20E.

With further reference to FIG. 12, the second IL 240 is formed on the gate dielectric layer 600, and the second work function layer 700 is formed on the second IL 240. The second IL 240 promotes better metal gate adhesion on the gate dielectric layer 600. In many embodiments, the second IL 240 further provides improved thermal stability for the gate structure 200, and serves to limit diffusion of metallic impurity from the work function metal layer 900 and/or the work function barrier layer 700 into the gate dielectric layer 600. In some embodiments, formation of the second IL 240 is accomplished by first depositing a high-k capping layer (not illustrated for simplicity) on the gate dielectric layer 600. The high-k capping layer comprises one or more of the following: HfSiON, HfTaO, HfTiO, HfTaO, HfAlON, HfZrO, or other suitable materials, in various embodiments. In a specific embodiment, the high-k capping layer comprises titanium silicon nitride (TiSiN). In some embodiments, the high-k capping layer is deposited by an ALD using about 40 to about 100 cycles at a temperature of about 400 degrees C. to about 450 degrees C. A thermal anneal is then performed to form the second IL 240, which may be or comprise TiSiNO, in some embodiments. Following formation of the second IL 240 by thermal anneal, an atomic layer etch (ALE) with artificial intelligence (AI) control may be performed in cycles to remove the high-k capping layer while substantially not removing the second IL 240. Each cycle may include a first pulse of $WCl_5$, followed by an Ar purge, followed by a second pulse of $O_2$, followed by another Ar purge. The high-k capping layer is removed to increase gate fill window for further multiple threshold voltage tuning by metal gate patterning.

Further in FIG. 12, after forming the second IL 240 and removing the high-k capping layer, the work function barrier layer 700 is optionally formed on the gate structure 200, in accordance with some embodiments. The work function barrier layer 700 is or comprises a metal nitride, such as TiN, WN, MoN, TaN, or the like. In a specific embodiment, the work function barrier layer 700 is TiN. The work function barrier layer 700 may have thickness ranging from about 5 A to about 20 A. Inclusion of the work function barrier layer 700 provides additional threshold voltage tuning flexibility. In general, the work function barrier layer 700 increases the threshold voltage for NFET transistor devices, and decreases the threshold voltage (magnitude) for PFET transistor devices.

The work function metal layer 900, which may include at least one of an N-type work function metal layer, an in-situ capping layer, or an oxygen blocking layer, is formed on the work function barrier layer 700, in some embodiments. The N-type work function metal layer is or comprises an N-type metal material, such as TiAlC, TiAl, TaAlC, TaAl, or the like. The N-type work function metal layer may be formed by one or more deposition methods, such as CVD, PVD, ALD, plating, and/or other suitable methods, and has a thickness between about 10 A and 20 A. The in-situ capping layer is formed on the N-type work function metal layer. In some embodiments, the in-situ capping layer is or comprises TiN, TiSiN, TaN, or another suitable material, and has a thickness between about 10 A and 20 A. The oxygen blocking layer is formed on the in-situ capping layer to prevent oxygen diffusion into the N-type work function metal layer, which would cause an undesirable shift in the threshold voltage. The oxygen blocking layer is formed of a dielectric material that can stop oxygen from penetrating to the N-type work function metal layer, and may protect the N-type work function metal layer from further oxidation. The oxygen blocking layer may include an oxide of silicon, germanium, SiGe, or another suitable material. In some embodiments, the oxygen blocking layer is formed using ALD and has a thickness between about 10 A and about 20 A.

FIG. 12 further illustrates the metal fill layer 290. In some embodiments, a glue layer (not separately illustrated) is formed between the oxygen blocking layer of the work function metal layer and the metal fill layer 290. The glue layer may promote and/or enhance the adhesion between the metal fill layer 290 and the work function metal layer 900. In some embodiments, the glue layer may be formed of a metal nitride, such as TiN, TaN, MoN, WN, or another suitable material, using ALD. In some embodiments, thickness of the glue layer is between about 10 A and about 25 A. The metal fill layer 290 may be formed on the glue layer, and may include a conductive material such as tungsten, cobalt, ruthenium, iridium, molybdenum, copper, aluminum, or combinations thereof. In some embodiments, the metal fill layer 290 may be deposited using methods such as CVD, PVD, plating, and/or other suitable processes. In some embodiments, a seam 510, which may be an air gap, is formed in the metal fill layer 290 vertically between the channels 22A, 22B. In some embodiments, the metal fill layer 290 is conformally deposited on the work function metal layer 900. The seam 510 may form due to sidewall deposited film merging during the conformal deposition. In some embodiments, the seam 510 is not present between the neighboring channels 22A, 22B.

FIGS. 13A-16C illustrate formation of the source/drain contact isolation structures 150 in accordance with various embodiments. The source/drain contact isolation structures 150 may be formed prior to formation of the source/drain contacts 120 (see FIG. 1E, for example).

FIGS. 13C, 14C, 15C, 16C are cross-sectional top views of the device 10 taken along the line C-C shown in FIGS. 13A, 13B, 14A, 14B, 15B, 15C, 16C, 16D. FIGS. 13A, 14A, 15A, 16A are cross-sectional side views of the device 10 taken along the line A-A shown in FIGS. 13C, 14C, 15C, 16C. FIGS. 13B, 14B, 15B, 16B are cross-sectional side views of the device 10 taken along the line B-B shown in FIGS. 13C, 14C, 15C, 16C.

Figure 13A:
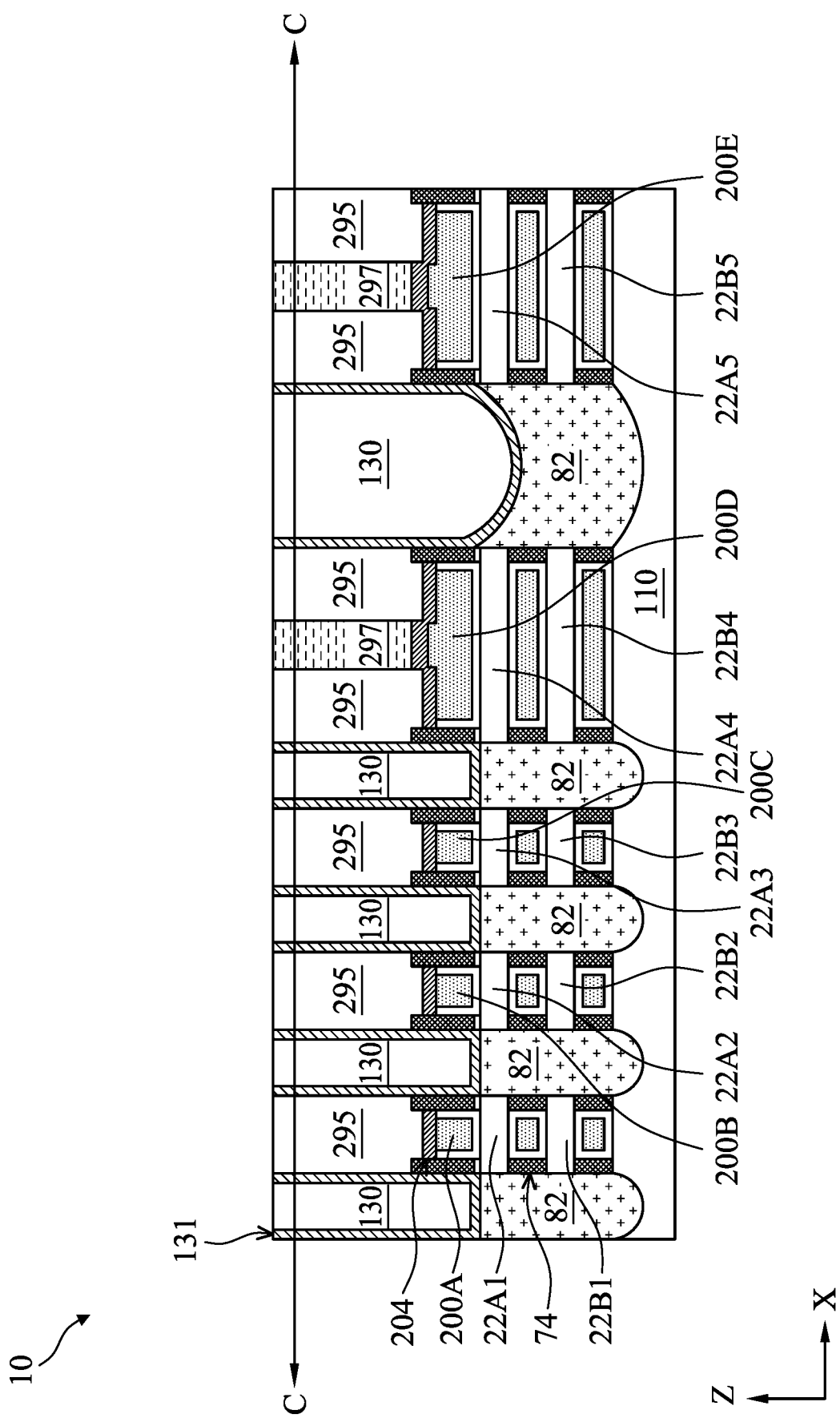
Figure 13B:
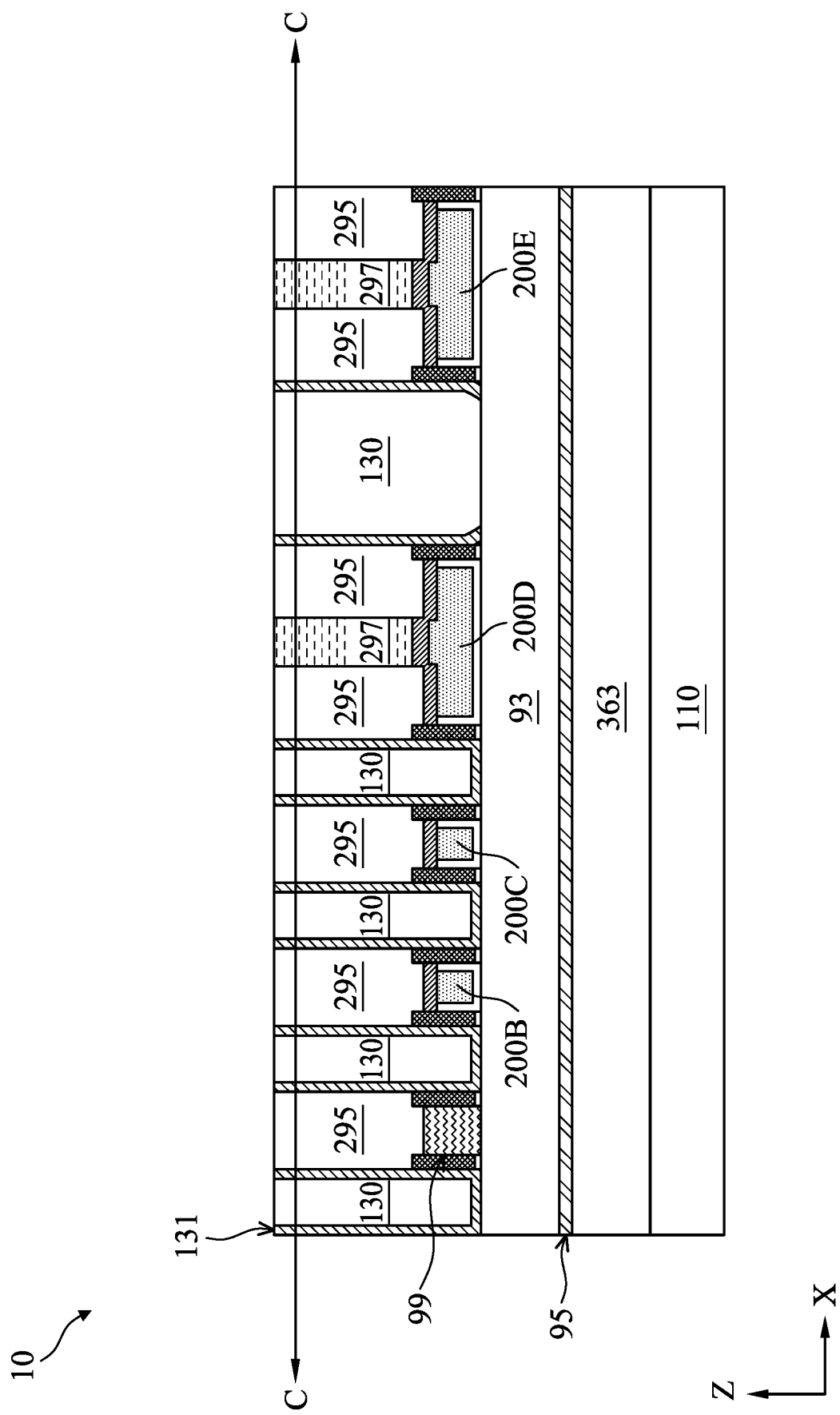
Figure 13C:
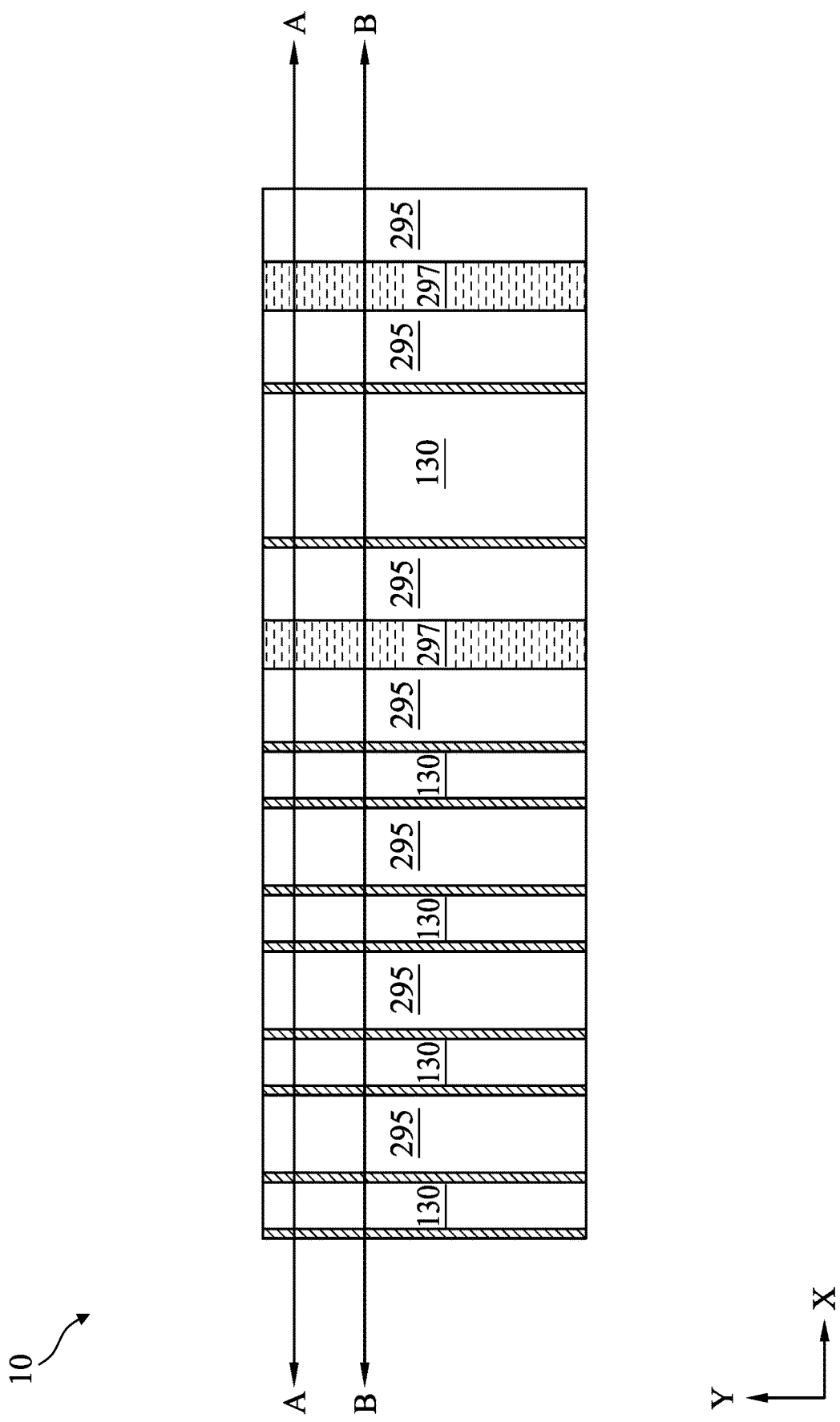

In FIGS. 13A-13C, following formation of the gate structures 200A-200E, overlying the gate dielectric layer 600 and the gate fill layer 290 are a conductive layer 204, an optional hard dielectric layer (not shown), and a capping layer 295. The conductive layer 204 reduces contact resistance between a gate contact (not shown) and the gate fill layer 290. In some embodiments, the conductive layer 204 comprises a metal, such as tungsten, aluminum, copper, ruthenium, or the like.

The capping layer 295, also referred to as a "self-aligned capping" (SAC) layer, may provide protection to the underlying gate structure 200A-200E, and may also act as a CMP stop layer when planarizing the source/drain contacts 120 following formation thereof. The capping layer 295 may be a dielectric layer including a dielectric material, such as SiO2, SiN, SiCN, SiC, SiOC, SiOCN, HfO2, ZrO2, ZrAlOx, HfAlOx, HfSiOx, Al2O3, BN, or other suitable dielectric material. Between the capping layer 295 and the conductive layer 204 is the optional hard dielectric layer. The hard dielectric layer may prevent current leakage following one or more etching operations, which may be performed to form gate contacts, source/drain contacts 120, isolation structures (e.g., source/drain contact isolation structures 150), or the like. In some embodiments, the hard dielectric layer is or comprises a dielectric material that is harder than, for example, the capping layer 295, such as aluminum oxide, or other suitable dielectric material. The hard dielectric layer may also be between the capping layer 295 and the spacer layer 41. In some embodiments, over gate structures 200D, 200E and channels 22A4-22B5, the capping layer 295 may be split by a support structure 297, as shown. In some embodiments, width (X direction) of the capping layer 295 is in a range of about 8 nm to about 40 nm.

Figure 14A:
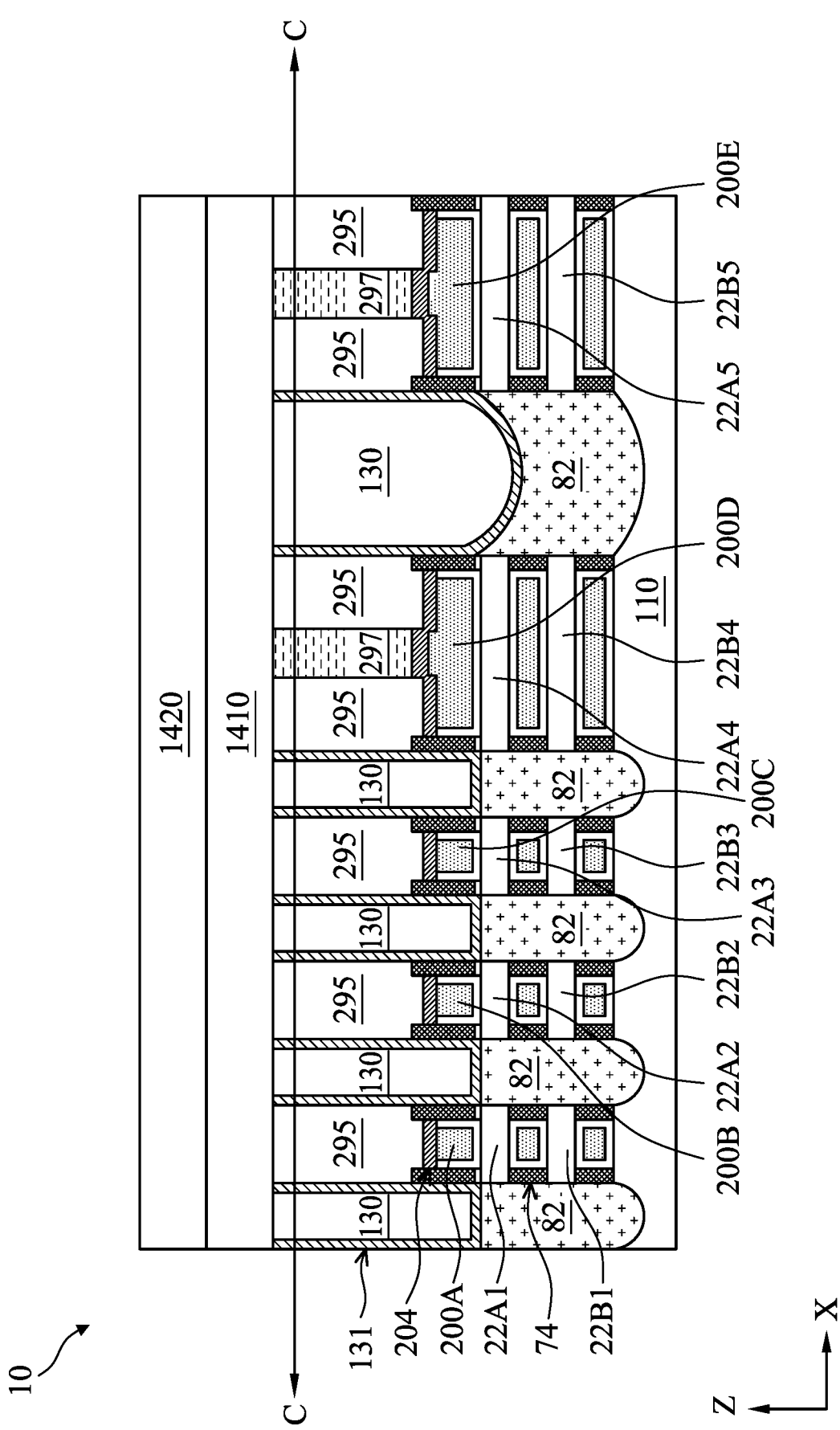
Figure 14B:
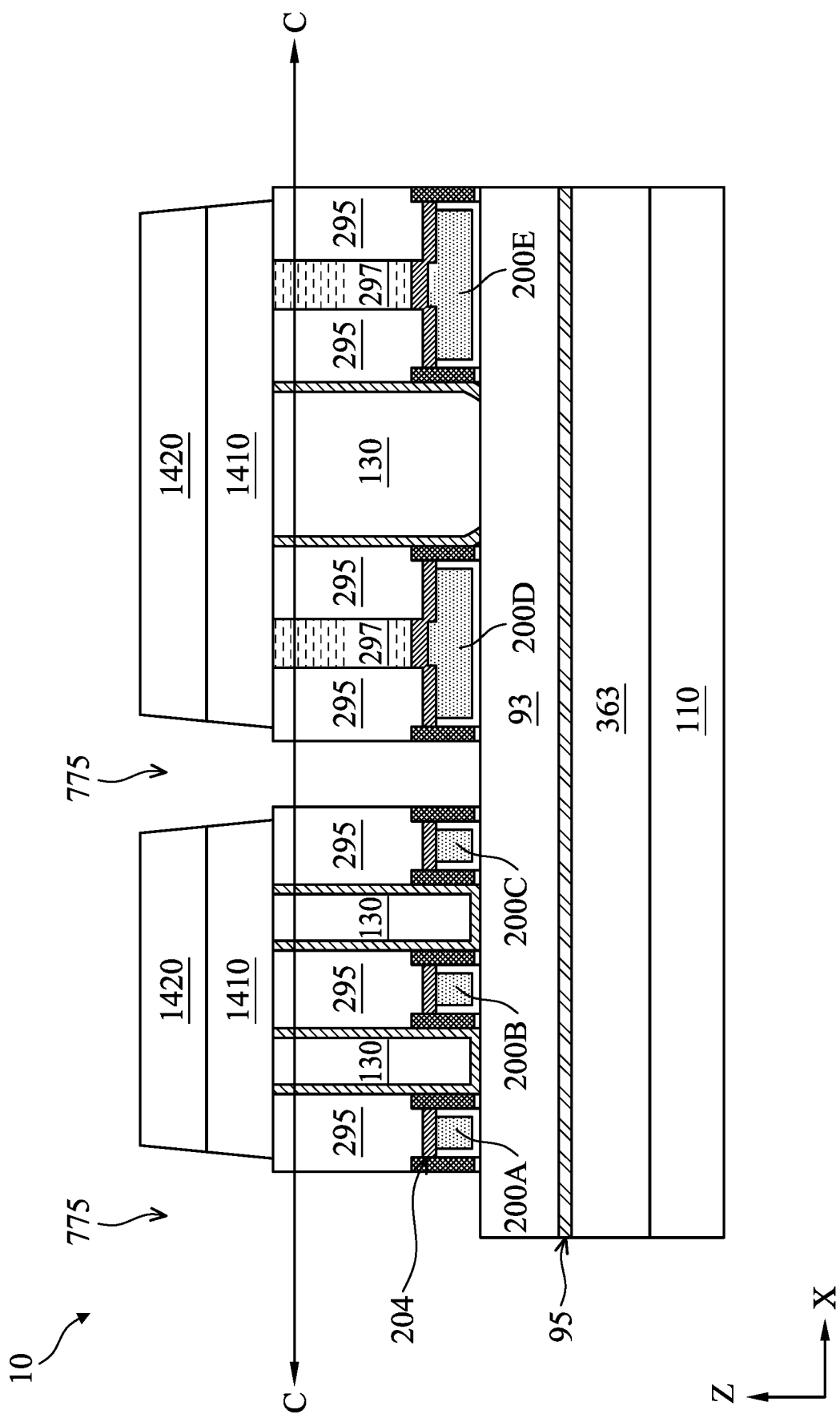
Figure 14C:
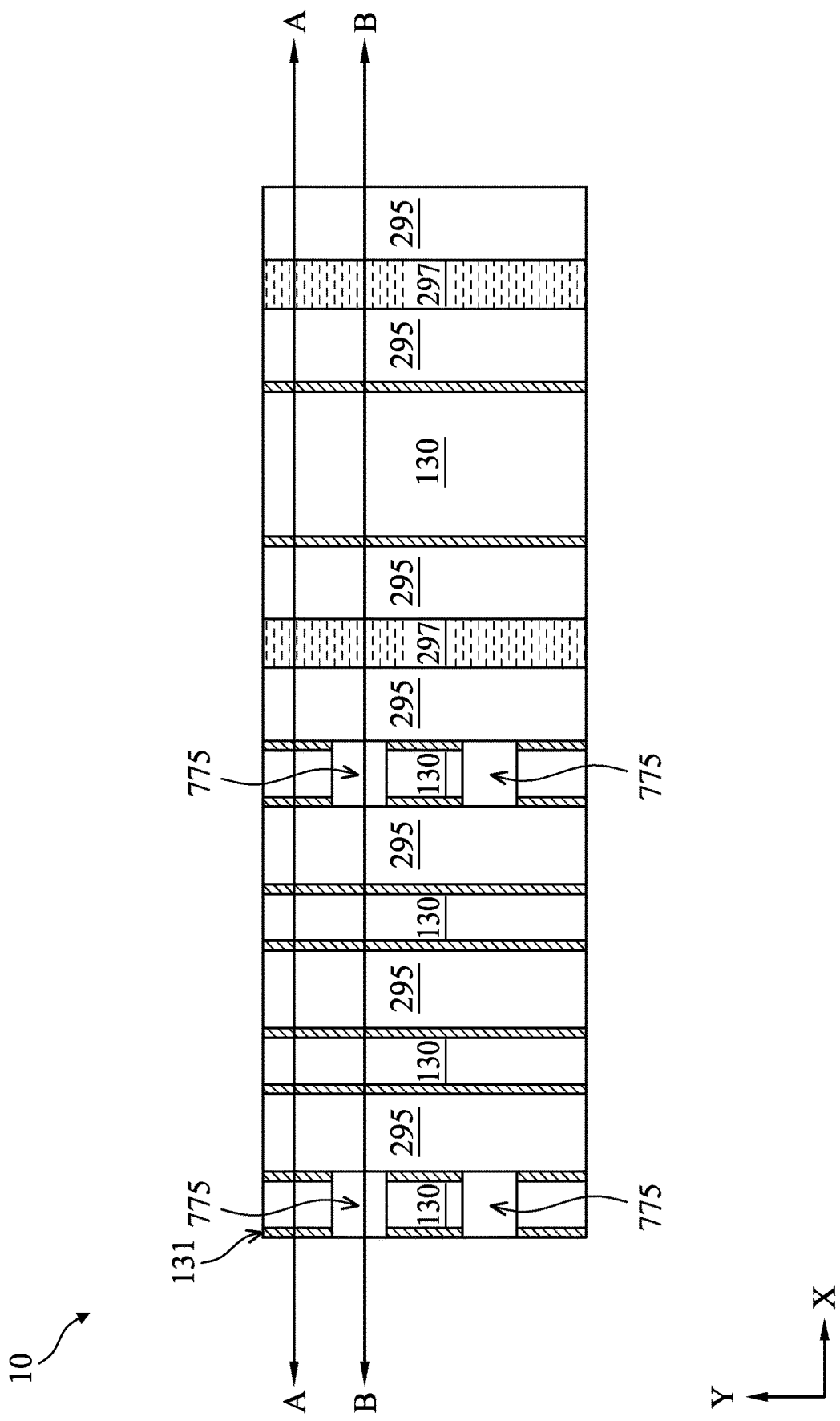

In FIGS. 14A-14C, openings 775 are formed, corresponding to act 1500 of FIG. 17. The source/drain contact isolation structures 150 are formed in the openings 775 in subsequent operations. The openings 775 may be formed by one or more masking operations followed by one or more etching operations. In some embodiments, a first masking layer 1410 is formed over the top surface of the device 10, followed by a second masking layer 1420 formed over the first masking layer 1410. The first and second masking layers 1410, 1420 may be any appropriate masking layer, such one or more of a photoresist layer, a hard mask layer, an anti-reflective coating layer, or the like. Following formation of the first and second masking layers 1410, 1420, the openings 775 are formed to the upper surface of the ILD 130 and the CESL 131 by patterning the first and second masking layers 1410, 1420. The patterning may include exposing the second masking layer 1420 to light, such as deep ultraviolet (DUV) or extreme ultraviolet (EUV) light, then removing exposed or unexposed portions of the second masking layer 1420, for example, by a rinsing step. Following patterning of the second masking layer 1420, the openings 775 may be extended into the first masking layer 1420 by, for example, an etching operation. Following patterning of the first masking layer 1420, the openings 775 may expose the capping layer 295, the ILD 130 and the CESL 131.

Following exposing the capping layer 295, the ILD 130 and the CESL 131, the ILD 130 may be removed by one or more removal operations. The removal operations may include an etching operation that is selective to the ILD 130 compared to the CESL 131 and the capping layer 295.

Following removal of the ILD 130, the CESL 131 is exposed in the openings 775. The openings 775 are expanded by trimming (e.g., tapered) the CESL 131 by one or more etching operations that is selective to the CESL 131 compared to the capping layer 295, the source/drain region 82, and the spacer layer 41, corresponding to act 1600 of FIG. 17. In some embodiments, the CESL 131 is removed completely where exposed by the openings 775, as shown in FIG. 14B. FIG. 16B shows a partially trimmed CESL 131 in accordance with various embodiments. In some embodiments, the trimming forms a tapered profile of reduced thickness in the CESL 131, as shown by the CESL 131CMD in FIG. 1F and FIG. 16B. In some embodiments, the trimming reduces thickness of the CESL 131 in the openings 775 by at least about 50%, such as by about 60% or as much as 100% (complete removal).

Prior to etching of the CESL 131, the portions of the openings 775 below the upper surface of the capping layer 295 may each have an aspect ratio (height/width) that is greater than about 7, which may lead to formation of voids in subsequent deposition of the source/drain contact isolation structures 150. Following etching of the CESL 131, the portions of the openings 775 are expanded, and may each have an aspect ratio less than about 5, which prevents the formation of the voids in the source/drain contact isolation structures 150. The openings 775 land on (e.g., expose) the hybrid fin 94, such as the fill layer 93 of the hybrid fin 94.

Figure 15A:
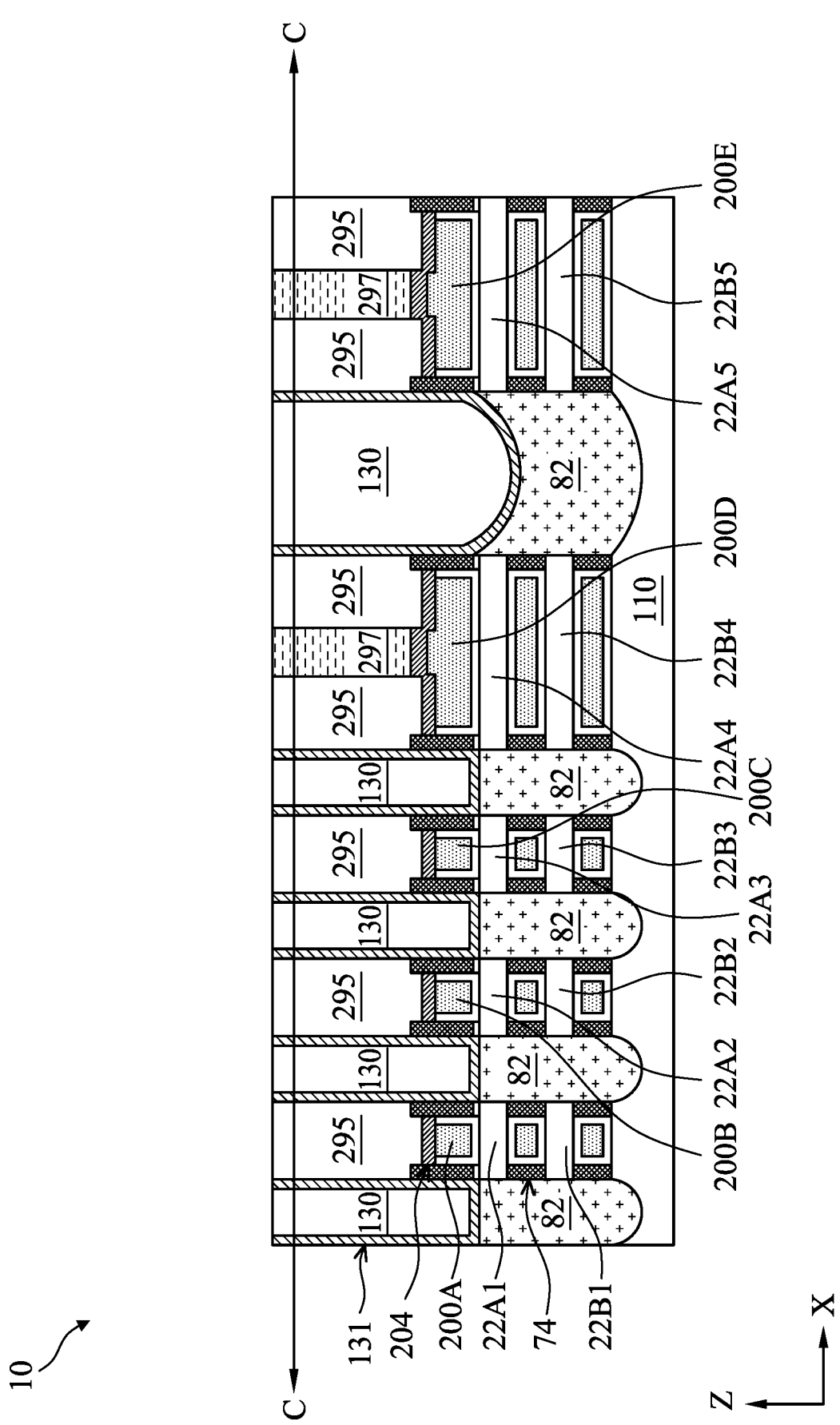
Figure 15B:
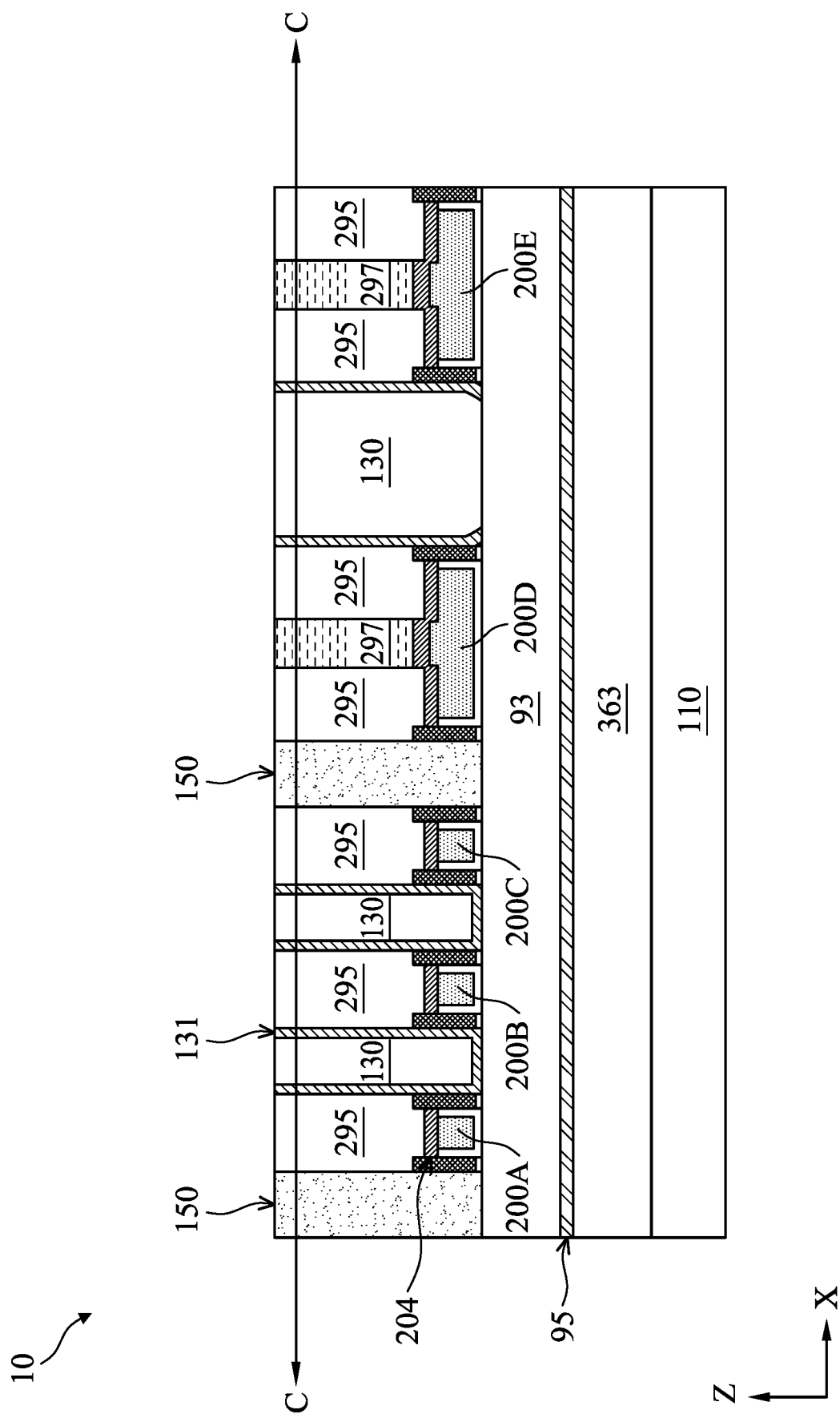
Figure 15C:
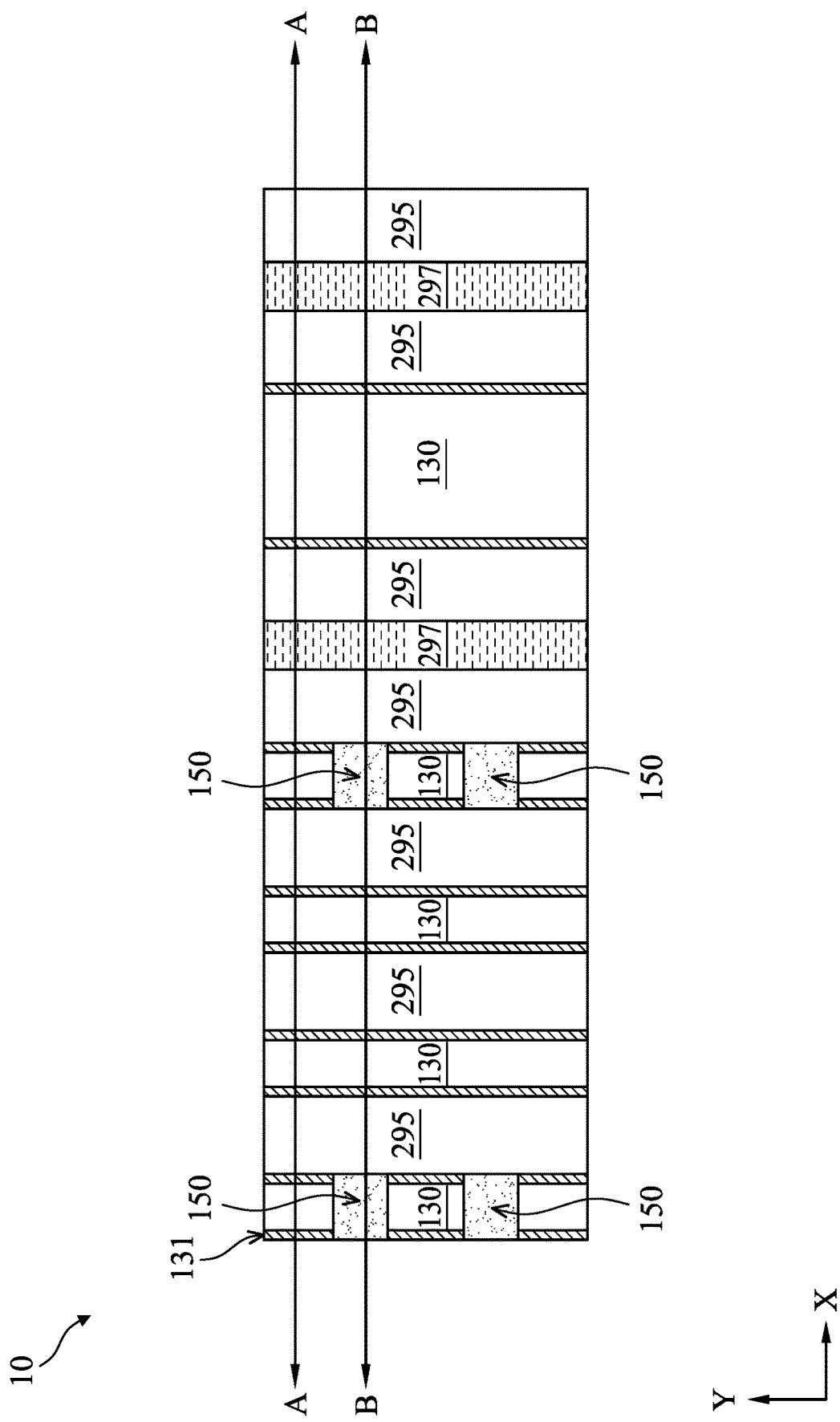

In FIGS. 15A-15C, the first and second masking layers 1410, 1420 are removed, for example, by ashing, CMP or another suitable method, and the source/drain contact isolation structures 150 are formed by filling in the openings 775, corresponding to act 1700 of FIG. 17. In some embodiments, the source/drain contact isolation structures 150 are formed by depositing a dielectric material in the openings 775 by, for example, CVD, ALD, or another suitable process. The dielectric material may be or include one or more of SiN, SiCN, SiC, SiOC, SiOCN, HfO2, ZrO2, ZrAlOx, HfAlOx, HfSiOx, Al2O3. Following filling of the openings 775 with the dielectric material, the source/drain contact isolation structures 150 have aspect ratio (height/width) less than about 5. In some embodiments, height of the source/drain contact isolation structures 150 may be in a range of about 15 nm to about 40 nm. In some embodiments, width (X direction) of the source/drain contact isolation structures 150 may be in a range of about 8 nm to about 30 nm. In some embodiments, the aspect ratio is in a range of about 0.5 to about 5. The reduced aspect ratio compared to when the CESL 131 is present and untrimmed (e.g., about 5 nm in thickness) provides benefits of increased production yield, better filling of the dielectric material (e.g., substantially no voids present) and an expanded potential pool of dielectric materials available for use in isolating the source/drain contacts 120.

In FIGS. 16A-16C, and with reference to FIG. 16B, in some embodiments, the CESL 131 in the openings 775 is partially removed, e.g., trimmed and tapered, which forms the CESL 131CMD shown. The trimming may include stopping the etching operation used to remove the CESL 131 prior to full removal of the CESL 131. Following the partial removal of the CESL 131 to form the CESL 131CMD, the width of the source/drain contact isolation structures 150 may vary (e.g., decrease) in a direction toward the substrate 110. In some embodiments, greatest thickness of the CESL 131CMD lining the source/drain contact isolation structures 150 may be in a range of about 0.5 nm to about 2 nm, and least thickness of the CESL 131CMD approaches 0 nm due to tapering. In some embodiments, greatest width of the source/drain contact isolation structure 150 may be in a range of about 8 nm to about 30 nm, and least width of the source/drain contact isolation structure 150 may be in a range of about 6 nm to about 29.5 nm. Due to tapering of the CESL 131CMD, aspect ratio of the source/drain contact isolation structures 150 may be calculated differently based on trapezoidal shape of the source/drain contact isolation structures 150. Assuming a smooth taper of the CESL 131CMD, the aspect ratio may be equal to height of the source/drain contact isolation structure 150 over average width of the source/drain contact isolation structure 150. In some embodiments, the aspect ratio of the trapezoidal source/drain contact isolation structure 150 may be in a range of about 0.5 to about 6. The reduced aspect ratio compared to when the CESL 131 is present and untrimmed (e.g., about 5 nm in thickness) provides benefits of increased production yield, better filling of the dielectric material (e.g., substantially no voids present) and an expanded potential pool of dielectric materials available for use in isolating the source/drain contacts 120. In addition to these benefits, presence of the CESL 131CMD may provide additional structural and/or electrical protection to the spacer layers 41 and the gate structures 200A-200E. Presence or removal of the CESL 131CMD may be weighed based on desire for better filling performance (thinner or no CESL 131CMD) or better protection (thicker CESL 131CMD).

Additional processing may be performed to finish fabrication of the GAA devices 20A-20E. For example, gate contacts 184 (see FIG. 1B) may be formed to electrically couple to the gate structures 200A-200E, such as the gate structure 200C. An interconnect structure may then be formed over the source/drain contacts 120 and the gate contacts 184. The interconnect structure may include a plurality of dielectric layers surrounding metallic features, including conductive traces and conductive vias, which form electrical connection between devices on the substrate 110, such as the GAA devices 20A-20E, as well as to IC devices external to the IC device 10. In some embodiments, second capping layers (not shown) are present over the source/drain contacts 120. Configurations in which only the capping layers 295 over the gate structures 200A-200E are present (e.g., no second capping layers present over the source/drain contacts 120) may be considered "single SAC" structures, and configurations in which the capping layers 295 and the second capping layers are both present may be considered "double SAC" structures. The source/drain contact isolation structures 150 with reduced aspect ratio are compatible with both single SAC and double SAC configurations.

Embodiments may provide advantages. By removing or thinning the CESL 131 prior to filling in the source/drain contact isolation structures 150, the aspect ratio of the openings 775 in which the source/drain contact isolation structures 150 are filled is reduced, which reduces the likelihood of formation of voids. As such, production yield may be increased, filling performance is improved and the potential material pool for the source/drain contact isolation structures 150 is expanded.

In accordance with at least one embodiment, a device includes: a substrate; a gate structure wrapping around at least one vertical stack of nanostructure channels; a source/drain region abutting the gate structure; a source/drain contact over the source/drain region; an etch stop layer laterally between the source/drain contact and the gate structure and having a first sidewall in contact with the source/drain contact, and a second sidewall opposite the first sidewall; and a source/drain contact isolation structure embedded in the source/drain contact and having a third sidewall substantially coplanar with the second sidewall of the etch stop layer.

In accordance with at least one embodiment, a device includes: a substrate; a first source/drain region in and on the substrate; a second source/drain region laterally separated from the first source/drain region; a gate structure between the first and second source/drain regions; a source/drain contact over the first source/drain region, and having a first sidewall and a second sidewall opposite the first sidewall; a source/drain contact isolation structure over the second source/drain region, and having a third sidewall and a fourth sidewall opposite the third sidewall; first liner layers lining the first and second sidewalls; and second liner layers lining the third and fourth sidewalls, the second liner layers thinner than the first liner layers.

In accordance with at least one embodiment, a method includes: forming a first source/drain region and a second source/drain region on and in a substrate, the first source/drain region laterally separated from the second source/drain region; forming a first liner layer over the first source/drain region and a second liner layer over the second source/drain region; forming a first fill layer over the first liner layer and a second fill layer over the second liner layer; forming an opening in the first fill layer; expanding the opening by trimming the first liner layer; and forming an isolation structure by filling the expanded opening with a dielectric material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
a substrate;
a gate structure wrapping around at least one vertical stack of nanostructure channels;
a source/drain region abutting the gate structure;
a source/drain contact over the source/drain region;
an etch stop layer laterally between the source/drain contact and the gate structure and having a first sidewall in contact with the source/drain contact, and a second sidewall opposite the first sidewall; and
a source/drain contact isolation structure embedded in the source/drain contact and having a third sidewall substantially coplanar with the second sidewall of the etch stop layer, the aspect ratio (height/width) of the source/drain contact isolation structure is less than the aspect ratio (height/width) of the source/drain contact.

2. The device of claim 1, further comprising a capping layer overlying the gate structure, wherein the capping layer has a fourth sidewall in contact with the second sidewall of the etch stop layer and the third sidewall of the source/drain contact isolation structure.

3. The device of claim 2, further comprising a first gate spacer layer abutting the gate structure, wherein the first gate spacer layer is in contact with the third sidewall and the capping layer.

4. The device of claim 1, wherein the source/drain contact isolation structure has a fifth sidewall in contact with the source/drain contact and the etch stop layer, the fifth sidewall extending in a direction substantially perpendicular to the third sidewall.

5. The device of claim 1, wherein:
the source/drain contact is in contact with the source/drain region; and
the source/drain contact isolation structure is in contact with a hybrid fin abutting the source/drain region.

6. The device of claim 5, wherein:
the source/drain contact is in contact with a silicide region of the source/drain region; and
the source/drain contact isolation structure in is in contact with an epitaxial region of the source/drain region.

7. A device comprising:
a substrate;
a first source/drain region in and on the substrate;
a second source/drain region laterally separated from the first source/drain region;
a gate structure between the first and second source/drain regions;
a source/drain contact over the first source/drain region, and having a first sidewall and a second sidewall opposite the first sidewall;
a source/drain contact isolation structure over the second source/drain region, and having a third sidewall and a fourth sidewall opposite the third sidewall, the aspect ratio (height/width) of the source/drain contact isolation structure is less than the aspect ratio (height/width) of the source/drain contact;
first liner layers lining the first and second sidewalls; and
second liner layers lining the third and fourth sidewalls, the second liner layers thinner than the first liner layers.

8. The device of claim 7, wherein:
the first liner layers have thickness in a range of about 1 nm to about 5 nm.

9. The device of claim 7, wherein the second liner layers have a tapered profile that is wider proximal the substrate.

10. The device of claim 7, wherein the aspect ratio of the source/drain contact isolation structure is less than 5.

11. The device of claim 7, wherein thickness of the second liner layers is in a range from about 0.5 nm to about 2 nm.

12. The device of claim 7, wherein extension portions of the second liner layers extend beyond the source/drain contact isolation structure, and thickness of the extension portions is substantially the same as thickness of the first liner layers.

13. The device of claim 7, wherein the source/drain contact isolation structure has a tapered profile that is narrower proximal the substrate.

14. A method, comprising:
    forming a first source/drain region and a second source/drain region on and in a substrate, the first source/drain region laterally separated from the second source/drain region;
    forming a first liner layer over the first source/drain region and a second liner layer over the second source/drain region;
    forming a first fill layer over the first liner layer and a second fill layer over the second liner layer;
    forming an opening in the first fill layer;
    expanding the opening by trimming the first liner layer;
    forming an isolation structure by filling the expanded opening with a dielectric material;
    forming source/drain contact openings by removing the first and second fill layers after forming the isolation structure; and
    forming at least three source/drain contacts by filling the source/drain contact openings;
    wherein the aspect ratio (height/width) of the isolation structure is less than the aspect ratio (height/width) of the source/drain contacts.

15. The method of claim 14, wherein forming the isolation structure includes forming the isolation structure having a tapered profile that is narrower proximal the substrate.

16. The method of claim 14, wherein trimming the first liner layer includes forming a tapered profile with reduced thickness in the first liner layer by an etching process.

17. The method of claim 14, wherein trimming the first liner layer includes reducing thickness of the first liner layer by at least 50%.

18. The method of claim 17, wherein trimming the first liner layer includes completely removing the first liner layer in the opening.

19. The method of claim 14 wherein the aspect ratio of the isolation structure is less than 5.

20. The method of claim 19, further comprising:
    forming first self-aligned capping layers over a gate structure between the first and second source/drain regions; and
    forming second self-aligned capping layers over the source/drain contacts.

* * * * *